United States Patent
Sacks et al.

(10) Patent No.: US 10,958,034 B2
(45) Date of Patent: Mar. 23, 2021

(54) NARROWBAND DEPOLARIZED FIBER LASERS

(71) Applicant: ELBIT SYSTEMS ELECTRO-OPTICS ELOP LTD., Rehovot (IL)

(72) Inventors: Zachary Sacks, Rehovot (IL); Boaz Lissak, Rehovot (IL); Ofer Gayer, Rehovot (IL)

(73) Assignee: ELBIT SYSTEMS ELECTRO-OPTICS ELOP LTD., Rehovot (IL)

( * ) Notice: Subject to any disclaimer, the term of this patent is extended or adjusted under 35 U.S.C. 154(b) by 0 days.

(21) Appl. No.: 16/463,248

(22) PCT Filed: Nov. 30, 2017

(86) PCT No.: PCT/IL2017/051304
§ 371 (c)(1),
(2) Date: May 22, 2019

(87) PCT Pub. No.: WO2018/100579
PCT Pub. Date: Jun. 7, 2018

(65) Prior Publication Data
US 2019/0288481 A1 Sep. 19, 2019

(30) Foreign Application Priority Data
Nov. 30, 2016 (IL) .......................... 249320

(51) Int. Cl.
*H01S 3/067* (2006.01)
*H01S 3/30* (2006.01)
(Continued)

(52) U.S. Cl.
CPC .......... *H01S 3/302* (2013.01); *H01S 3/06754* (2013.01); *H01S 3/0941* (2013.01);
(Continued)

(58) Field of Classification Search
CPC ............ H01S 3/06754; H01S 2301/03; H01S 3/10061
See application file for complete search history.

(56) References Cited

U.S. PATENT DOCUMENTS 5,252,497 A * 10/1993 Idler ...................... G01R 29/26
324/613
5,910,852 A * 6/1999 Fontana ............... H04B 10/532
398/185
(Continued)

OTHER PUBLICATIONS

International Search Report of International Patent Application No. PCT/IL/2017/051304 dated Mar. 25, 2018.
(Continued)

*Primary Examiner* — Michael Carter
(74) *Attorney, Agent, or Firm* — Pearl Cohen Zedek Latzer Baratz LLP

(57) ABSTRACT

Depolarized fiber lasers and respective methods are provided for increasing the SBS (stimulated Brillouin scattering) threshold. The laser source is constructed by a frequency-broadened seed source having a frequency bandwidth of less than 50 GHz, and the depolarization of the seed source is carried out at time scales shorter than 10 ns. At least one amplifier is configured to receive and amplify radiation from the frequency-broadened seed source and deliver the amplified radiation in the optical fiber. Depolarization may be achieved in various ways (e.g., using an interferometer with added length to one arm) and is kept at time scales shorter than tens of nanoseconds, typically shorter than 5-10 ns, which distinguish it from random polarization having polarization changes at longer time scales. Polarization maintaining fibers may be used to further increase the SBS by separating the polarizations states.

19 Claims, 11 Drawing Sheets

(51) Int. Cl.
H01S 3/094 (2006.01)
H01S 3/10 (2006.01)
H01S 3/23 (2006.01)
H01S 3/0941 (2006.01)

(52) U.S. Cl.
CPC .... *H01S 3/094003* (2013.01); *H01S 3/10053* (2013.01); *H01S 3/10061* (2013.01); *H01S 3/2316* (2013.01); *H01S 2301/03* (2013.01)

(56) References Cited

U.S. PATENT DOCUMENTS

| | | | |
|---|---|---|---|
| 6,850,712 | B1 | 2/2005 | Delavaux et al. |
| 7,199,924 | B1 | 4/2007 | Brown et al. |
| 7,233,422 | B2 | 6/2007 | Endo et al. |
| 7,535,631 | B2 | 5/2009 | Brown et al. |
| 7,539,231 | B1 | 5/2009 | Honea et al. |
| 7,778,290 | B2 | 8/2010 | Sack et al. |
| 8,970,935 | B2 | 3/2015 | Dennis et al. |
| 9,762,020 | B1* | 9/2017 | Stampoulidis ...... H01S 3/06766 |
| 2002/0031152 | A1* | 3/2002 | Funabashi ................ H01S 5/12 372/43.01 |
| 2004/0008918 | A1* | 1/2004 | Azami ................... G02B 6/274 385/11 |
| 2005/0248820 | A1 | 11/2005 | Moser et al. |
| 2007/0086492 | A1 | 4/2007 | Betin et al. |
| 2008/0309931 | A1* | 12/2008 | Silberberg ............. G01N 21/65 356/301 |
| 2009/0238568 | A1* | 9/2009 | Lyubomirsky ..... H04B 10/2914 398/79 |
| 2011/0085149 | A1 | 4/2011 | Nathan |
| 2012/0275477 | A1* | 11/2012 | Berendt ............. H01S 3/06758 372/18 |
| 2013/0044768 | A1 | 2/2013 | Ter-Mikirtychev |
| 2013/0063808 | A1 | 3/2013 | Rothenberg |
| 2016/0164240 | A1* | 6/2016 | Boland ................ H01S 3/2316 359/238 |

OTHER PUBLICATIONS

Sato et al. 2005, Chirp characteristics of 40Gb/s directly modulated distributed feedback laser diodes, IEEE JLT 23(11):3790-3797.

J. Coles, Advanced phase modulation techniques for stimulated Brillouin scattering suppression in fiber optic parametric amplifiers, UC San Diego, Master's Thesis, 2009.

Zeringue et al., 2012, A theoretical study of transient stimulated Brillouin scattering in optical fibers seeded with phase-modulated light, Optics Express, 20(19): 21196-21213.

Flores et al., 2014, Pseudo-random binary sequence phase modulation for narrow linewidth, kilowatt, monolithic fiber amplifiers, Optics Express, 22(15): 17735-17744.

White et al., 2014, A linearly chirped seed suppresses SBS in high-power fiber amplifiers, allows coherent combination, and enables long delivery fibers, Proc. of SPIE vol. 8961 896102-1.

White et al., 2012, Suppression of stimulated Brillouin scattering in optical fibers using a linearly chirped diode laser, Optics Express, 20(14): 15881.

Burns et al., 1991, Depolarized source for fiber-optic applications, Optics Letters, vol. 16(6): 381-383.

Guasoni et al., 2014, Intensity noise-driven nonlinear fiber polarization scrambler, Optics Letters, 39(18):5309-5312.

Agrawal, 2012, Nonlinear fiber optics, 5th edition, Chapter 9: 334-335.

Spring et al., 2005, Comparison of stimulated Brillouin Scattering thresholds and spectra in non-polarization-maintaining and polarization maintaining passive fibers, Proc. SPIE 5709: 147-156.

Oskar van Deventer et al., 1994, Polarization Properties of Simulated Brillouin Scattering in Single-Mode Fibers, Journal of Lightwave Technology, vol. 12, 4: 585-590.

Zheng et al., 2016 (10.8 kW spectral beam combination of eight all-fiber superfluorescent sources and their dispersion compensation, Optics Express, 24(11) pp. 12063-12071).

Department of the Army, a robust electric laser initiative, solicitation No. W9113M-13-C-0043.

Honea, et al., 2015, "Advances in Fiber Laser Spectral Beam Combining for Power Scaling," Proc. of SPIE vol. 9730, pp. 97300 Y-1-97300 Y-9.

Limpert et al., 2007, "The rising power of fiber lasers and amplifier," IEEE Journal of Selected Topics in Quantum Electronics, vol. 13, No. 3, pp. 537-545.

Honea, et al., 2013, "Spectrally beam combined fiber lasers for high power efficiency and brightness," Proc. SPIE, vol. 8601, pp. 860115-1-860115-5.

Wirth, et al., 2009, "2kW incoherent beam combining for four narrow-linewidth photonic crystal fiber amplifiers," Optics Express, vol. 17, No. 3, pp. 1178-1183.

Extended European Search Report for EP Patent Application No. EP17875639.1, dated Jul. 10, 2020.

* cited by examiner

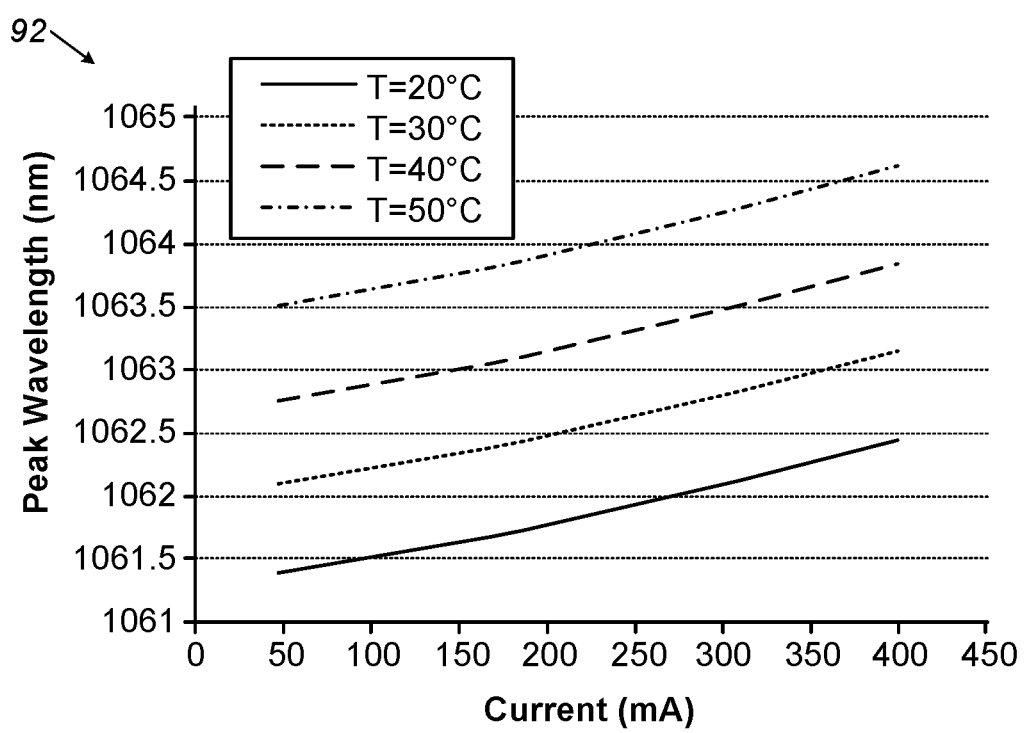
Figure 2 – Prior Art

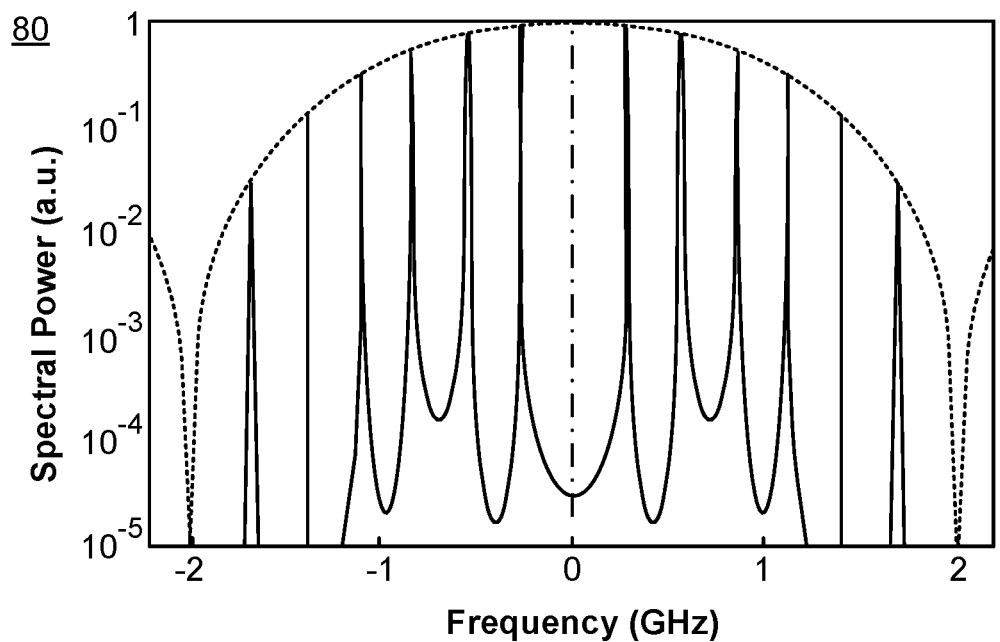
*Figure 4A – Prior art*
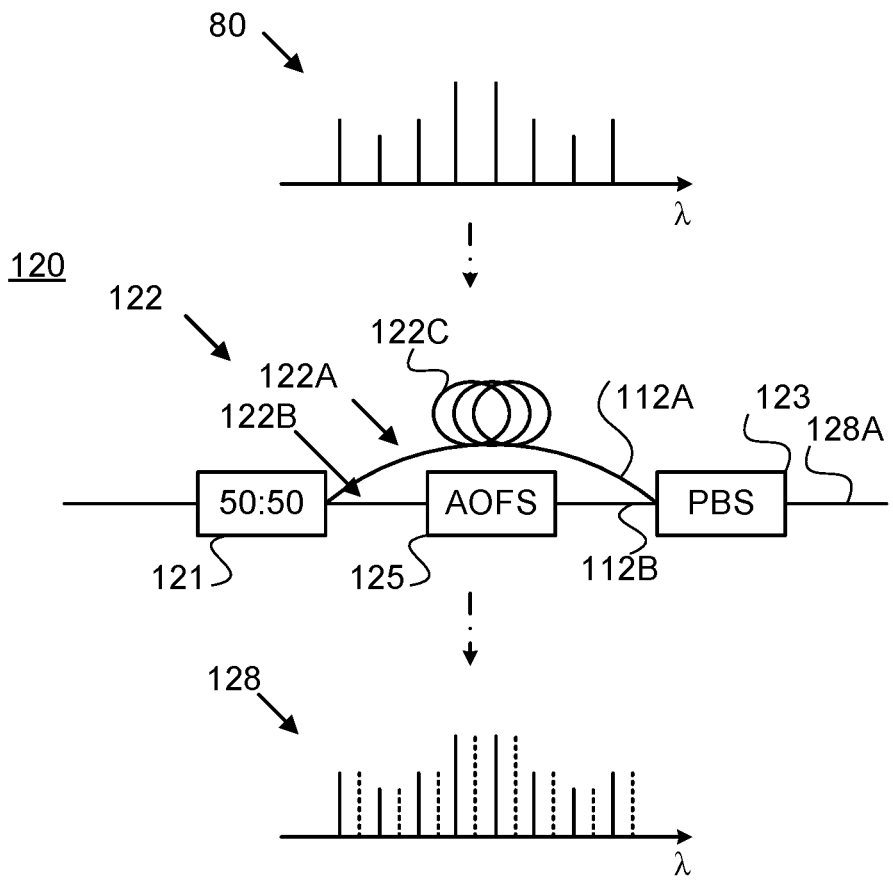
*Figure 4B*

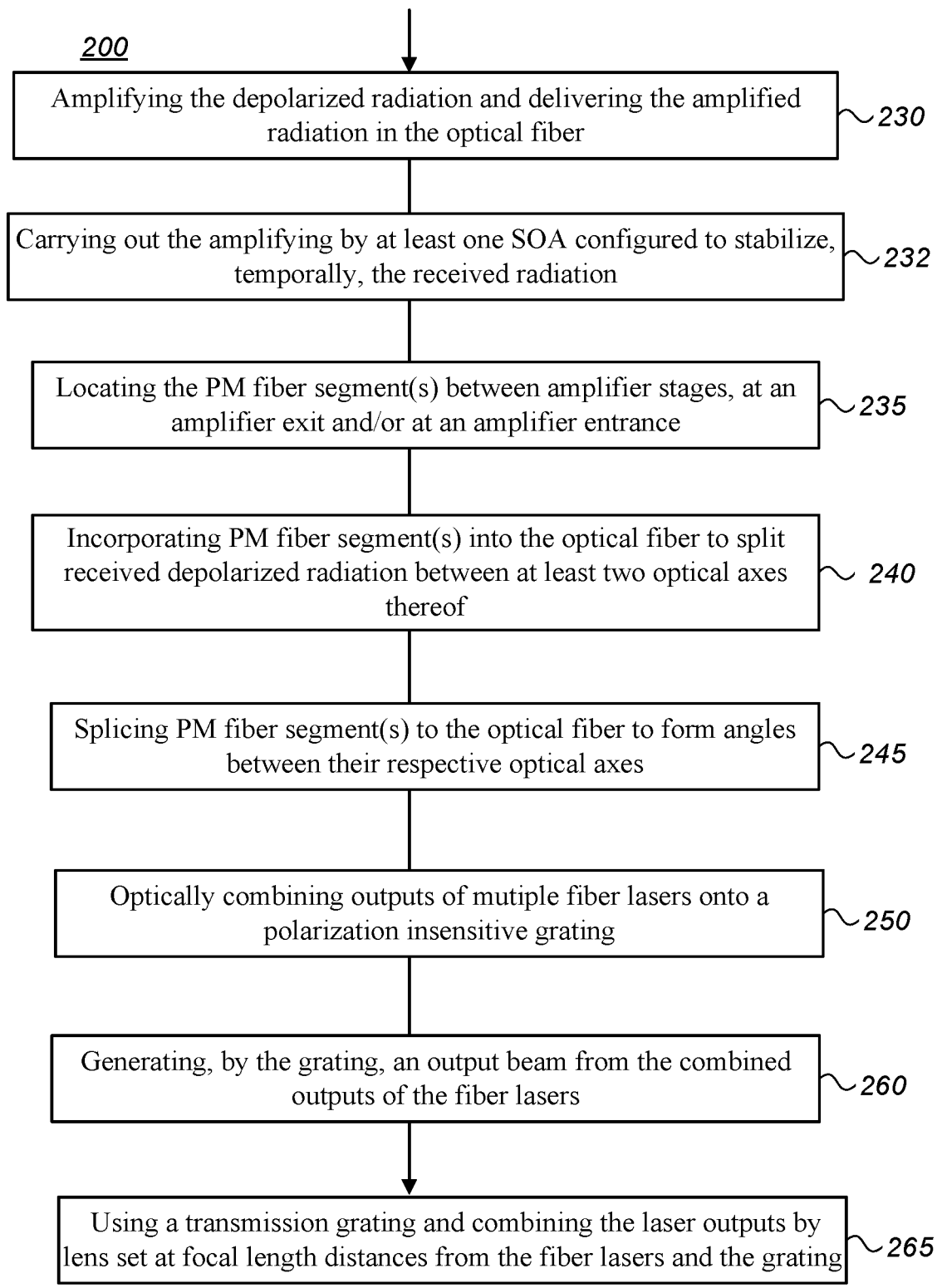
Figure 10 (Cont. 1)

NARROWBAND DEPOLARIZED FIBER LASERS

CROSS-REFERENCE TO RELATED APPLICATIONS

This application is a National Phase Application of PCT International Application No. PCT/IL2017/051304, International Filing Date Nov. 30, 2017, entitled: "NARROWBAND DEPOLARIZED FIBER LASERS", published on Jun. 7, 2018, under publication No. WO 2018/100579, which claims the priority of IL Patent Application No. 249320, filed on Nov. 30, 2016, which is hereby incorporated by reference in its entirety.

BACKGROUND OF THE INVENTION

1. Technical Field

The present invention relates to the field of fiber lasers, and more particularly, to increasing the SBS (stimulated Brillouin scattering) threshold in narrowband fiber lasers.

2. Discussion of Related Art

Narrowband lasers are useful for a variety of applications including frequency conversion and laser beam combining, namely spectral beam combining (SBC) and coherent beam combining (CBC). The narrower the spectra of these lasers, the easier it is to obtain high efficiency wavelength conversion or high quality beam combining. However, the lower limit of the bandwidth of the laser is often limited by a nonlinear effect known as stimulated Brillouin scattering (SBS), especially in fiber lasers. The broader the spectrum of the laser the higher the power limit imposed by SBS. Thus, SBS places a lower limit on the bandwidth achievable at a given power level in a given laser. In addition, the SBS limit also depends on the polarization state of the laser. In addition to power and bandwidth, price is also an important factor.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a fiber laser comprising a frequency-broadened narrowband seed source having a spectral width of less than 10 GHz, which is broadened to a spectral width of less than 50 GHz, a depolarizer coupled to an output of the seed source and configured to provide a depolarized output which is depolarized on time scales shorter than 50 ns, and at least one amplifier configured to receive and amplify the depolarized output.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 2 illustrates an exemplary dependence of the peak wavelength of diodes on the current and temperature, according to the prior art.

FIG. 4A schematically illustrates a region in an exemplary PRBS spectrum, according to the prior art.

FIG. 4B is a high level schematic illustration of spectrum interleaving by the depolarizer, according to some embodiments of the invention.

DETAILED DESCRIPTION OF THE INVENTION

Figure 1A:
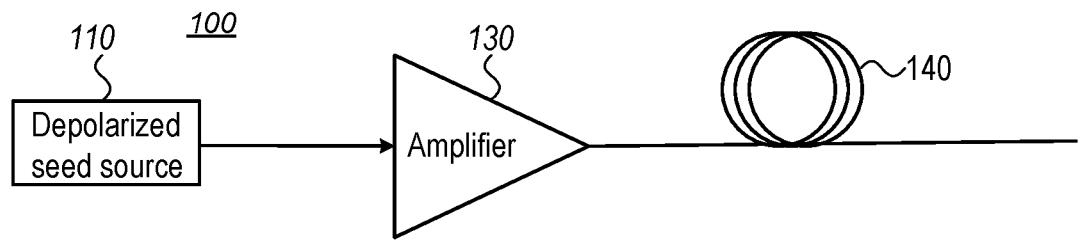
FIGS. 1A-1D are high level schematic illustrations of fiber lasers, according to some embodiments of the invention.
Figure 1B:
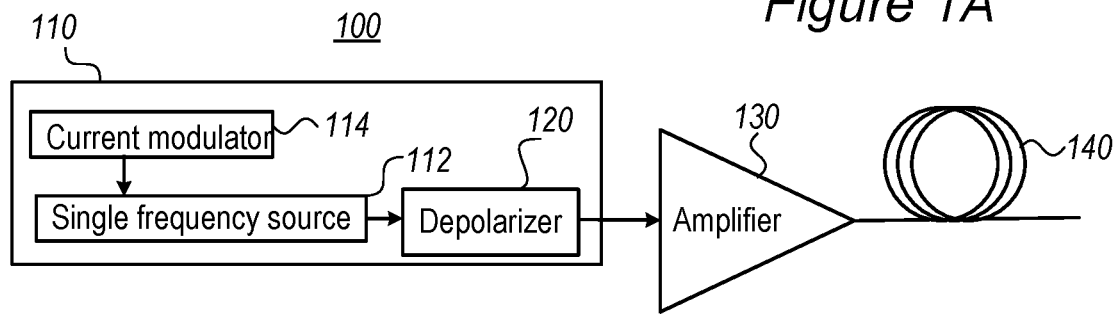
Figure 1C:
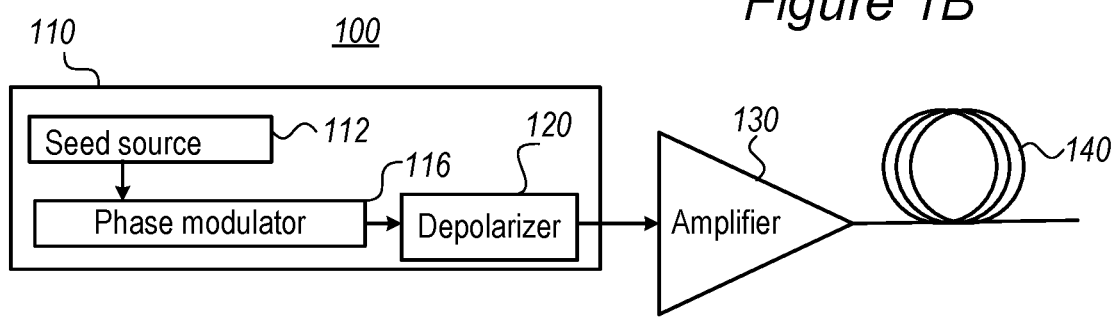

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. Any of the disclosed modules or units may be at least partially implemented by a computer processor.

Random Polarization Versus Depolarization

First, it may be helpful to set forth definitions of certain terms that will be used hereinafter. In particular, the physical and practical distinction between randomly polarized radiation and depolarized radiation is set forth in the following.

The term "randomly polarized" as used in this application refers to radiation having a polarization that varies at time scales larger than ten nanoseconds, typically microsecond and longer, which can be actively aligned into polarized radiation using optical elements. Randomly polarized radiation is therefore both detectable and controllable. In particular, optical elements can be used to convert randomly polarized radiation into polarized radiation that delivers similar power. For example General Photonics produces a fiber optic polarization tracker POS-002 that is able to actively adjust the polarization state on millisecond time scales.

The term "depolarized" as used in this application refers to radiation having a polarization that varies at time scales shorter than ten nanoseconds, typically shorter than 5 ns and even shorter. Depolarized radiation cannot be actively aligned into polarized radiation using optical elements and its polarization is therefore not controllable although it may be detectable. Using any configuration of optical elements, any derived depolarized radiation may carry half the power of the original depolarized radiation at most. For example, if the depolarized radiation is transmitted through two quarter wave plates and then a polarizer, any orientation of the quarter wave plates yields an equal split of power into the output polarization states of the polarizer.

Randomly and depolarized radiation may be generated from a polarized source as follows. When a polarized source is connected to a fiber, the fiber rotates the polarization to an undefined or random state depending on internal changes in the refractive index due to bends, pressure, manufacturing variations, and temperature. The polarization state can also change in time due to external perturbations. The polarization at the fiber output can be made linear, for example, by placing a polarization controller anywhere along the optical path.

In order to generate depolarized radiation, the coherence length of the source is taken into account. In general, any polarization state can be represented as the magnitude of the two orthogonal polarization components and their phase relationship. If there exists a phase relationship which is detectable, then the radiation is polarized (e.g., circularly, linearly or randomly). For example, circular polarization has an equal power split between each state and a 90° phase shift between the linear polarization states. If the phase relationship is not constant over short periods of time, e.g., 10s of nanoseconds in this disclosure, then the polarization state is constantly changing and the radiation is depolarized. A depolarized source can be constructed by taking a polarized source, splitting the power into two equal parts, and then recombining them with a delay of more than the coherence length of the light. Thus, when the two states combine there is no temporally stable phase relation between the orthogonal polarization states resulting in depolarization. Mathematically, if the coherence length, $L_c$, is less than the delay between the combining, $\Delta L$, $\Delta L \gg L_c$, then the light is depolarized. It is noted that L here denotes an equivalent length measured in the same medium, typically vacuum. Thus, it is more straightforward to think of $L_c$ and $\Delta L$ as time, i.e., coherence time and delay, respectively. As discussed below, depolarization may be implemented by a variety of means (e.g., a Mach-Zehnder interferometer shown in FIG. 5D below).

Depolarized Fiber Lasers

Depolarized MOPA (master oscillator power amplifier) fiber lasers and respective methods are provided for increasing the SBS (stimulated Brillouin scattering) threshold to either increase the laser power or decrease the laser bandwidth. A frequency-broadened seed source may be used at an optical frequency bandwidth smaller than 50 GHz (using e.g., a frequency-broadened narrowband seed source having a spectral width of less than 10 GHz, which is broadened to a spectral width of less than 50 GHz), wherein a depolarization of the seed source is carried out at time scales shorter than 10 ns, and at least one amplifier is configured to receive and amplify radiation from the frequency-broadened seed source and deliver the amplified radiation into an optical delivery fiber, which may comprise a terminating and end cap or a collimator. In some embodiments, the delivery fiber can be the active fiber of the amplifier itself or another integral amplifier component such as a pump signal combiner. Depolarization may be achieved in various ways (e.g., using an interferometer with added length to one arm to cause a temporal delay longer than the coherence time of the source) and is kept at time scales shorter than 10 ns, typically shorter than 5 ns, which distinguishes it from prior art random polarization having polarization changes at longer time scales, as explained above. Polarization maintaining fibers may be used to increase the SBS by allowing only two non-correlated orthogonal polarization states to propagate along the fiber. The following provides introductory comparison with the prior art, followed by disclosure of various embodiments of the current invention.

Embodiments of the present invention provide narrowband depolarized fiber laser seeders for wavelength conversion and spectral beam combining. Spectral beam combining (SBC) is a proven way to obtain tens of kilowatts of laser power in a nearly diffraction limited beam. For example, prior art implementations (e.g., a robust electric laser initiative, solicitation number: W9113M-13-C-0043, Department of the Army) obtained 30 kW lasers by combining 330 W narrow band fiber lasers using a single diffraction grating. One requirement for these lasers is that the spectral bandwidth is small enough to avoid increasing the beam divergence by the grating via angular dispersion.

Analysis of Shortcomings of the Prior Art

In the following, the inventors present an analysis of shortcomings of the prior art which indicates, in a non-limiting manner and without being bound by theory, the improvements and advantages provided by the present invention.

In order to obtain high power and narrow linewidth, generally the MOPA configuration is selected. The master oscillator provides a narrow line width source that is then amplified by an amplifier or a series of amplifiers. In a MOPA configuration, the spectrum from the seeder is not necessarily maintained at the output of the laser. Spectrally broadening may occur. Zheng et al. 2016, "10.8 kW spectral beam combination of eight all-fiber superfluorescent sources and their dispersion compensation", Optics Express, 24(11): 12063-12071, teach SBC using eight 1.5 kW using a fiber laser amplifier seeded by ASE (amplified spontaneous emission) narrowband sources. In this particular configuration, the seed sources for the fiber amplifiers are polarized and broad bandwidth, ~18.5 GHz. In addition, spectral broadening occurs within the fiber amplifiers resulting in a bandwidth of 0.5 nm at 1.5 kW of output power. The large bandwidth of 0.5 nm is too large for efficient wavelength conversion or beam combining.

Honea, et al. 2015, "Advances in Fiber Laser Spectral Beam Combining for Power Scaling," Proc. of SPIE Vol. 9730, 97300, describe a 30 kW spectrally combined laser based on narrow line, 3 GHz, polarized fiber lasers constructed from polarization maintaining (PM) fiber components. They were able to achieve narrow line widths by using phase modulation of single frequency DFB diode sources. Using such a modulation technique, spectral broadening is insignificant within the laser since cross phase modulation between different frequency components is believed to cause the majority of spectral broadening. The power of each single laser module in Honea, et al. 2015 was limited to about 330 W which is believed to be due to SBS.

Polarization has also been explored as a way to increase the SBS threshold and thus the output laser power. Oskar van Deventer et al. 1994, "Polarization Properties of Simulated Brillouin Scattering in Single-Mode Fibers", Journal of Lightwave Technology, vol. 12, 4: 585-590 theoretically show that the polarization state of the laser can influence the SBS threshold in passive fibers. Spring et al. 2005, "Comparison of stimulated Brillouin Scattering thresholds and spectra in non-polarization-maintaining and polarization maintaining passive fibers," Proc. SPIE 5709: 147-156, present experimental results and a theoretical model demonstrating the SBS thresholds in polarization maintaining (PM) and non-polarization maintaining (non-PM) fibers. It was shown that splitting the laser power equally along the fiber axes can increase the SBS threshold by a factor of two.

In the quest to reduce component cost and system assembly complexity, a method for producing narrow bandwidth lasers is sought. PM fibers and fiber components are more expensive than non-PM components and require special care when used in lasers as the polarization state is degraded by splices, components, temperature, and stress.

When combining lasers spectrally using a single grating (SBC), the beam quality of the output beam, $M^2$, can be related to the spectral width of the constituent laser bandwidths by $$dM^2 = \frac{\omega\pi}{2\lambda\Lambda\cos\theta_L}d\lambda,$$

where w is the radius of the beam at focus, $\lambda$ is the laser wavelength, $\Lambda$ is the diffraction grating period, $\theta_L$ is the Littrow angle which is assumed to be close to the angle of incidence and reflection on the grating, and $d\lambda$ is the bandwidth of the laser (See Limpert et al. 2007, "The rising power of fiber lasers and amplifier," IEEE Journal of Selected Topics in Quantum Electronics, 13(3), 537-545). Using this equation and assuming the design parameters given in public documents, when using $M^2 \approx 1$ input beams the beam quality degrades to $M^2 \approx 3$ using 10 GHz bandwidth beams. Due to the direct relation of the $M^2$ of the combined beam on the constituent laser bandwidths, it is desirable to have the smallest laser bandwidth possible, the practical limit of which being the SBS threshold of the laser.

Embodiments of the present invention provide narrowband depolarized fiber laser seeders for increasing the stimulated Brillouin scattering threshold in lasers, stimulated Brillouin scattering (SBS) being one of the limitations of laser power transmission over optical fibers. SBS, understood as backwards propagating scattering of optical photons off acoustic phonons, is especially problematic for narrowband laser sources, having bandwidths of the same scale as the SBS gain bandwidth. Prior art solutions for increasing the threshold include enlarging the MFD (mode field diameter) of the fiber mode, shortening the fiber, splicing multiple fibers to break the SBS wave, placing a thermal gradient along the fiber, engineering the acoustic properties of the fiber, and broadening or manipulating the spectrum of the laser source.

The stimulated Brillouin gain is zero for linearly polarized orthogonal pump and signal waves. Denoting the SBS threshold for using a PM (polarization-maintaining) fiber with the pump and signal having the same polarization by X, launching the pump beam at 45° with respect to the fiber axis increases the SBS threshold to 2× (Agrawal 2012, Nonlinear fiber optics, $5^{th}$ edition, Spring et al. 2005, "Comparison of stimulated Brillouin Scattering thresholds and spectra in non-polarization-maintaining and polarization maintaining passive fibers", Proc. SPIE 5709: 147-156). The increase by 2× can be thought of as there are two independent channels along the fiber each with the laser power. In case of using a regular fiber with random birefringence, the polarization of the pump and the polarization of the backward propagating signal (due to SBS) are randomly aligned and therefore yield a SBS threshold increase to 1.5×. The reason for this is that different polarization states are reflected differently from the SBS induced acoustic grating, namely that circular polarization states change handedness upon reflection (Oskar van Deventer et al. 1994, Polarization Properties of Simulated Brillouin Scattering in Single-Mode Fibers, Journal of Lightwave Technology, vol. 12, 4: 585-590).

Wavelength conversion also requires a narrow band laser source. For example, U.S. Pat. No. 7,778,290 discloses a depolarized diode for wavelength conversion. It is noted that U.S. Pat. No. 7,778,290 teaches lasers for producing infrared Band IV wavelengths, without mentioning frequency swept sources. The depolarized laser solution has the advantages of less expensive components, available components, ease of assembly (no polarization issues), and reduced nonlinear effects such as SRS and SBS. One of the main issues with such a laser is the appropriate seed source: the spectrum must be broad enough to allow for depolarization and be narrow enough for efficient wavelength conversion. In the past, several solutions have been proposed for seeders: (i) Diode and depolarizer—This solution is not guaranteed to be repeatable since the characteristics that allow for the SBS reduction cannot be specified. Diodes are typically operated in gain switched mode with each pulse starting from noise to give a different spectra. In practice, the bandwidth is large—as it appears on an OSA (optical spectrum analyzer) which takes temporal averages. (ii) EO (electro-optic) Phase Modulator and a depolarizer. An EO modulator is used to engineer the output spectrum before the depolarizer. The disadvantage includes the need for two actively modulated components. (iii) Polarization combining two diodes. Combining two cross polarized diodes should yield a depolarized source since the photons were generated independently. The disadvantage in this case is the cost of two diodes, twice the required electronics, and matching the frequency peak and bandwidths. This solution also does not guarantee suitable spectral properties of the diodes without much effort. (iv) Frequency seeded SOA diodes and a depolarizer. In this solution, a well-defined seeder such as an ASE source can be used to define the SOA spectrum. The SOA then acts as an amplifier and modulator on the signal to create temporal pulses. In practice, the bandwidth here is also quite large due since narrowing the spectrum in an ASE source also reduces the power injected into the SOA. The following disclosed solutions overcome at least in part these disadvantages and difficulties.

The fiber lasers used in SBC in the prior art may or may not be polarized to a fixed orientation depending, among other issues, on the diffraction efficiency of the grating for different polarization states. Often times the lasers are polarized for other reasons, namely the ability to engineer the spectral width of the laser. The most common way to shape the laser spectrum is to use a single frequency polarized source, e.g., a single frequency diode or fiber laser, and to pass it through a phase modulator. Common lithium niobate (LN) electro-optic phase modulators require a polarized input beam in order to affect the phase in time (and thus wavelength) of the input light. However, polarized lasers have several disadvantages, namely that (i) the thresholds for SBS and SRS are ⅔ and the threshold, respectively, with respect to a depolarized laser (Oskar van Deventer et al. 1994 cited above), (ii) the cost of PM components is typically 30-50% higher than the cost of the equivalent polarization independent components, (iii) the assembly of PM laser requires special attention to maintaining of the polarization state, a factor which increases the assembly cost, and (iv) linearly polarized fiber lasers above a few hundred watts are not practical using polarization maintaining LMA fiber with cores larger than 20 µm. As fiber laser systems generally consist of laser arrays, it is important to maximize the system's robustness and minimize its cost.

Disclosed embodiments may be advantageous with respect to prior art approaches, such as (i) using broadband diodes (0.5-1 nm) and a Mach-Zehnder type depolarizer with a temporal delay between the arms being greater than the coherence time, which is not appropriate for narrowband applications (e.g., a 1 nm band. equivalent to about 270 GHz, transforms a $M^2 \approx 1$ beam into a $M^2 \approx 9$ beam (U.S. Pat. No. 7,778,290); (ii) using an intensity noise driven nonlinear fiber polarization scrambler such as a fiber with random polarization birefringence (standard telecom fiber) for achieving ultrafast polarization modulation >100 GHz (Guasoni et al. 2014, Intensity noise-driven nonlinear fiber polarization scrambler, Optics Letters, 39(18): 5309-5312) as intensity noise can lead to spectral broadening and other practical implementation limits; (iii) using electro-optic polarization scramblers and fiber squeezers which are expensive active components and generally work on millisecond to microsecond time scales; and (iv) using two narrowband independent lasers combined in orthogonal polarizations for a depolarized source (Burns et al. 1991, Depolarized source for fiber-optic applications, Optics Letters, Vol. 16(6): 381-383) since this would requires precise alignment of the source wavelengths.

Coherent beam combining (CBC) is another method that can be used to combine several lasers into a high quality beam. The CBC method requires that each laser is polarized, at the same wavelength, and in phase with all lasers in the array. For spectral control of these lasers, recent work has shown that current modulating DFB diodes in conjunction with a semi-conductor optical amplifier (SOA) can produce very high frequency chirps useful for precisely controlling the wavelength as required for CBC (White et al. 2012, Suppression of stimulated Brillouin scattering in optical fibers using a linearly chirped diode laser, Optics Express, 20(14): 15881 and White et al. 2014, A linearly chirped seed suppresses SBS in high-power fiber amplifiers, allows coherent combination, and enables long delivery fibers, Proc. of SPIE Vol. 8961 896102-1). For example linear chirps can be obtained using narrow band diode, demonstrating a sweep of 4 nm in 2 ps (White et al. 2012). FIG. 2B illustrates an exemplary dependence 92 of the peak wavelength of diodes on the current and temperature, according to the prior art.

Some Configurations of Disclosed Fiber Lasers

FIGS. 1A-1D are high level schematic illustrations of MOPA fiber lasers 100, according to some embodiments of the invention. MOPA fiber laser 100 comprises an optical fiber 140 a frequency-broadened seed source 110, e.g., a frequency-broadened narrowband seed source having a spectral width of less than 10 GHz, which is broadened to a spectral width of less than 50 GHz, with a depolarization of seed source 110 being carried out at time scales shorter than 50 ns (or, in some embodiments, shorter than 10 ns), and at least one amplifier 130 (e.g., amplifier(s) 130 may comprise at least one semiconductor optical amplifier (SOA)) configured to receive and amplify radiation from frequency-broadened seed source 110 and deliver the amplified radiation into optical fiber 140. Amplifier(s) 130 such as SOA may be configured to stabilize, temporally, the received radiation. It is noted that the optical fiber shown in FIGS. 1A-1D may be the active fiber of the amplifier itself, and is not necessarily a separate component.

Frequency-broadened seed source 110 may comprise a single frequency source 112 (FIG. 1B) which is broadened by a temporal modulation, carried out e.g., by a current modulator 114 of the current supplied to the single frequency source, e.g., by a diode pump. Alternatively, frequency-broadened seed source 110 may comprise a phase modulator 116 (FIG. 1C) on the optical output of source 112. Alternatively or complementarily, frequency-broadened seed source 110 may comprise a frequency-swept narrowband distributed feedback (DFB) diode. For example, a frequency of the DFB diode may be swept by current modulation performed by current modulator 114. Alternatively or complementarily, frequency-broadened seed source 110 may comprise a phase modulator 116 configured to modulate a phase of the source radiation.

A depolarizer 120, set e.g., at the output of frequency-broadened seed source 110 and coupled thereto, may comprise an optical interferometer 122 configured to depolarize a polarized input thereto from a polarized source 112 (in certain embodiments of single frequency source 112, FIG. 1B) to provide a depolarized output. For example, depolarizer 120 may comprise interferometer 122 such as of a Mach-Zehnder type interferometer and/or a Lyot depolarizer and/or any other optical frequency shifting interferometer 122 configured to modify, spectrally, a wavelength of the amplified radiation in one arm of interferometer 122. Alternatively or complementarily, an optical frequency shifter may be used in depolarizer 120. Amplifier(s) 130 may be configured to receive and amplify the depolarized output, whether depolarizer 120 is part of the seed source or a separate unit. Amplifier(s) 130 may be configured to amplify the depolarized output to high power, e.g., to 1 W, 5 W or over 10 W.

Polarization maintaining (PM) fiber(s) 105 may be incorporated in MOPA fiber laser 100 in various alternative or complementary ways, some of which are shown schematically and denoted 142-145. PM fiber 105 is illustrated schematically as having a fast axis 112A and a slow axis 112B for respective radiation polarization directions.

For example, interferometer 122 may comprise at least one section of a polarization maintaining (PM) fiber 105 (142) with optical axes 112A, 112B of PM fiber 105 receiving each a half of the launched polarized light. In another example, optical fiber train 100 may comprise at least one segment of PM fiber 105 (144) having two optical axes 112A, 112B. The PM fiber segment may be configured to split received depolarized radiation between the at least two optical axes 112A, 112B thereof in order to increase the SBS threshold up to 2× over the polarized case occurring in prior art non-PM fiber with random polarization (see above the definitions of depolarized radiation and randomly polarized radiation).

In certain embodiments, PM fiber segment(s) 105 may be located in amplifier 130 and/or between stages of amplifier(s) 130 (143), e.g., as active PM fiber 105; and/or PM fiber segment(s) 105 may be located at an exit of amplifier 130 (144); and/or PM fiber segment(s) 105 may be located at an entrance of amplifier 130 (145).

In certain embodiments, PM fiber segment(s) 105 may comprise a plurality of PM fiber segments 105, spliced to form angles between their respective optical axes.

Any of the options listed above may be combined and implemented in any disclosed fiber laser 100.

Advantageously, disclosed fiber laser 100 with depolarized narrow-band laser seeder 110 may be used in SBC and wavelength conversion applications reduce the cost and increase robustness due to possibility of using a majority of lower cost and low-sensitivity non-PM while maintaining the high SBS threshold due to the PM fiber component(s) in fiber laser 100.

In certain embodiments, fiber laser 100 comprises wavelength controllable source 112 and depolarizer 120. The wavelength controllable source provides a seed to a fiber laser series of amplifiers that has narrow spectral width suitable for the application and that can be depolarized. Both of these constraints are generally require the opposite in spectral bandwidth: 1) wavelength conversion and SBC require a narrow bandwidth, while 2) depolarization and SBS reduction require a large spectral bandwidth. The solution here is to use a controlled temporally changing frequency to broaden the time integrated spectrum (what appears on spectral measurements) enough so that SBS is reduced and the laser can be depolarized.

It is emphasized that frequency-broadened seed source 110 with depolarizer 120 is configured to be depolarized rather than randomly polarized, in the sense that depolarization implies that the electromagnetic radiation has a polarization that varies at time scales shorter than tens of nanoseconds, e.g., 50 ns, possibly 10 ns, shorter than 5-10 ns and even shorter, while prior art random polarization merely relates to electromagnetic radiation having a polarization that varies at time scales larger than tens of nanoseconds, typically microsecond and longer, which can be turned into polarized radiation using optical elements. An essential distinguishing feature is that depolarized radiation cannot be turned into polarized radiation using optical elements and its polarization is therefore not detectable and not controllable. Using any configuration of optical elements, any derived polarize radiation may carry half the power of the original depolarized radiation at most. In contrast, prior art randomly polarized radiation is both detectable and controllable and optical elements can be used to convert randomly polarized radiation into polarized radiation that delivers similar power. To generate depolarized radiation from the given radiation, as in disclosed embodiments, the introduced phase between the components should be equivalent to a length $\Delta L \gg L_c$, where $L_c$ is the coherence length, before combining the components into the depolarized radiation (see illustration in FIG. 5D).

Exemplary Embodiments and Components

The inventors have found out that the SBS threshold may be increased by changing the spectral width and polarization state of the radiation fed into the fiber. The inventors have found out in exemplary measurements that using the depolarizing seed source may increase the SBS threshold by up to 30% in preliminary experiments and possibly much more in more advanced settings. In addition, the depolarized source may offer a narrower bandwidth than a non-depolarized source for the same output power, enabling better performance in an SBC system.

Figure 3A:
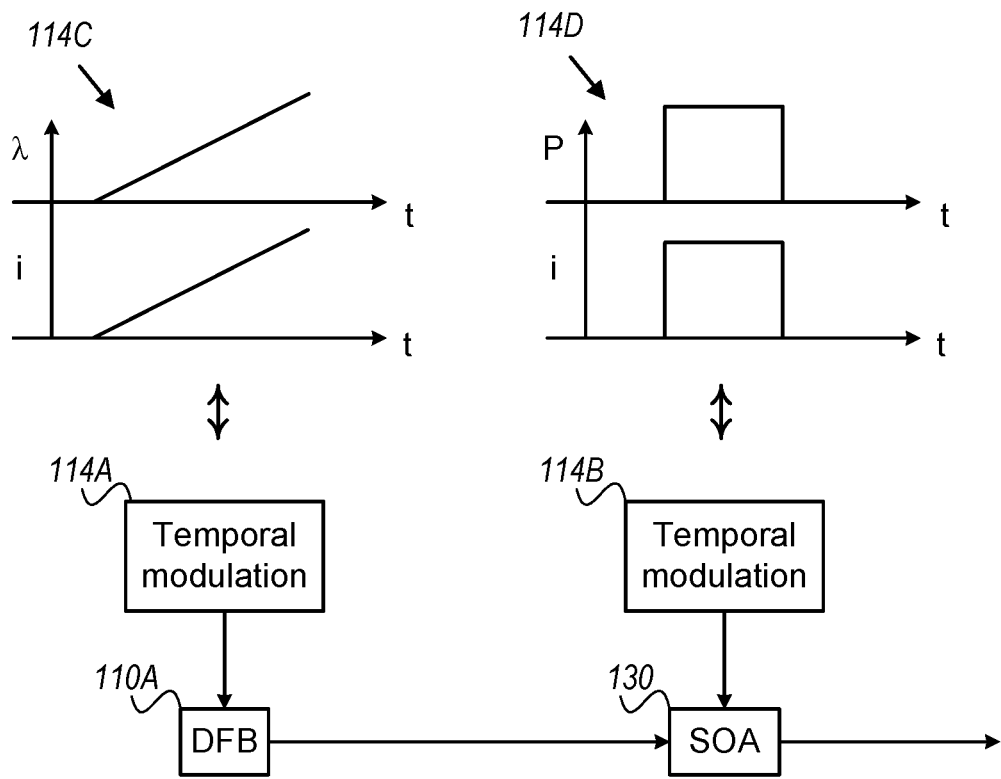
FIGS. 3A and 3B are high level schematic illustrations of a source, an amplifier and a depolarizer of fiber lasers, according to some embodiments of the invention.
Figure 3B:
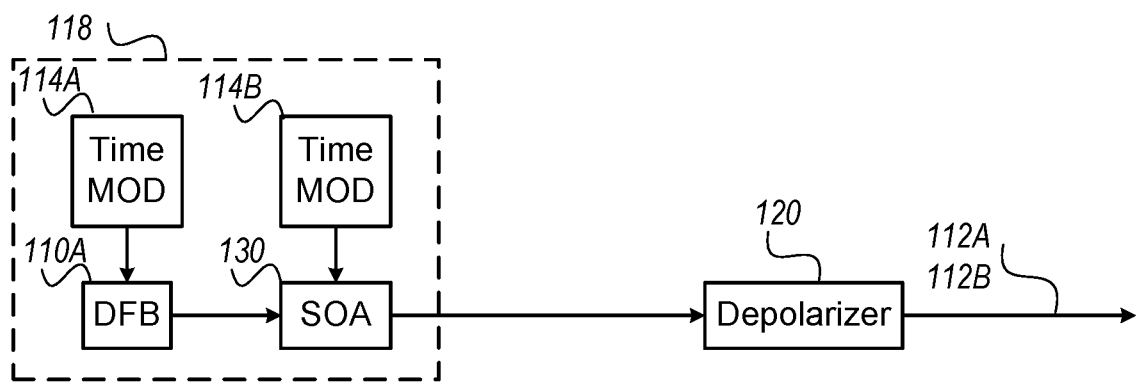

FIGS. 3A and 3B are high level schematic illustrations of source 110, amplifier 130 and depolarizer 120 of fiber lasers 100, according to some embodiments of the invention. Seed source 110 may be configured to have a well-controlled frequency spectrum, e.g., comprise a frequency-swept narrow-band distributed feedback diode (DFB) 110A. The frequency sweep may be configured to be fast enough to provide depolarization as explained above, to suppress or provide a stable SBS threshold. As the spectra of DFB diodes 110A change with current, a current modulation 114A on DFB diode 110A may be configured to provide both a spectrum (A) modulation 114C and an intensity (P) modulation 114D. Amplifier 130 may be SOA 130, configured to temporally modulate and/or stabilize the temporal profile pulse due to the power modulation also incurred by current modulation. SOA 130 may be configured to minimize or remove temporal modulation 114B.

Figure 1D:
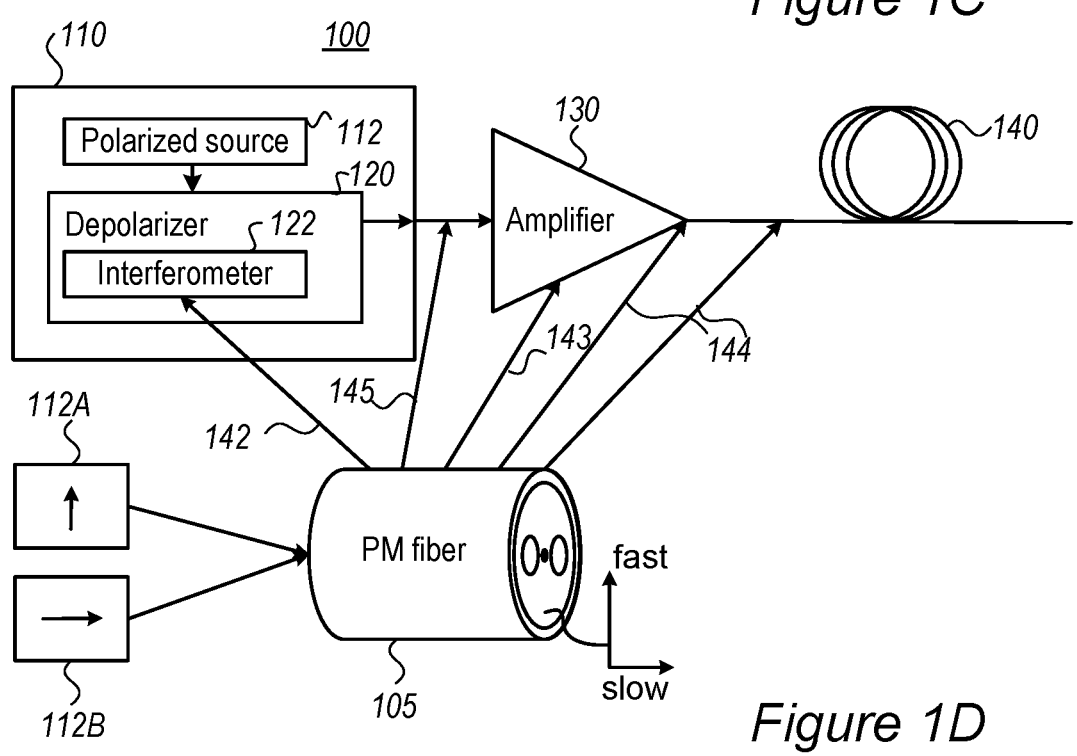

As illustrated in FIG. 3B, the depolarized seed source may comprise a seed source 118 with controllable bandwidth and a depolarizer 120 configured to provide a signal in orthogonal polarization states 112A, 112B (e.g., along fast and slow axes, see FIG. 1D). Depolarizer 120 may e.g., comprise interferometer 122. SOA 130 may be configured to operate in saturation to equalize the output power for all input powers, 114D, as illustrated schematically in FIG. 3A. A delay between channels 112A, 112B may be set to be greater than the period of the modulation. For example, light travels approximately 20 cm/ns in an optical fiber. If a 1 m long delay is used in depolarizer 120 (e.g., configured as interferometer 122 with the additional length introduced into one of the interferometer's arms), this would require the temporal coherence time to be less than 5 ns, or approximately 200 MHz bandwidth. Since the frequency is altered much faster than the travel time difference in depolarizer 120, a smooth depolarized output is obtained.

Taken as a specific non-limiting example, DFB diode 110A may be selected as Eagleyard EYP-DFB-1064-00040-1500-BFY02-0x0x, having a current coefficient of wavelength of 0.003 nm/mA and a maximum operating current of 190 mA. Assuming 150 mA of operation, it corresponds to a 0.45 nm shift over the modulation current range. The SBS gain bandwidth is typically 20-50 MHz, which is about 0.1 pm at 1064 nm. Therefore, a 1 mA change corresponds to 30× the SBS gain bandwidth. In one example of prior art (Sato 2005, see below) frequency chirps of a DFB diode, up to 0.38 nm of chirping was obtained for a 92 mA peak to peak current modulation. In another example, a linearly chirped diode with SOA compensation was used to obtain a rectangular frequency spectrum. In another example, II-VI Laser Enterprise can provide DFB diodes with the spectral characteristics taught by Sato et al. 2005, "Chirp characteristics of 40 Gb/s directly modulated distributed feedback laser diodes", IEEE JLT 23(11):3790-3797; with $d\lambda/dI \approx 0.003$ nm/mA (~800 MHz/mA) and $d\lambda/dT \approx 0.07$ nm/°C. For example, 40 Gb/s, 92 mA modulation peak to peak (48 GHz chirp at 1550 nm is 0.38 nm) and in another example, 10 Gb/s, 36 mA peak to peak (10 GHz chirp at 0.08 nm at 1550 nm).

In order to suppress SBS, the chirping parameter k may be configured to be larger than the Brillouin gain bandwidth $\Delta v_B$ within the phonon lifetime $\tau_p$ of the material, $k > \Delta v_B/\tau_p$ (Coles 2009, "Advanced phase modulation techniques for stimulated Brillouin scattering suppression in fiber optic parametric amplifiers", UC San Diego, Master's Thesis). Assuming $\Delta v_B = 50$ MHz, $\tau_p \approx 20$ ns, and the chirping parameter being 2.5 MHz/ns, or 0.009 pm/ns, which can be obtained by current modulation of DFB diode 110A with $d\lambda/dI \sim 0.003$ nm/mA.

In certain embodiments, other types of modulation may be used, such as pseudo random bit sequence (PRBS), which has been used successfully to reduce the SBS threshold in high power lasers (Flores et al. 2014, "Pseudo-random binary sequence phase modulation for narrow linewidth, kilowatt, monolithic fiber amplifiers", Optics Express, 22(15): 17735-17744; and Zeringue et al. 2012, "A theoretical study of transient stimulated Brillouin scattering in optical fibers seeded with phase-modulated light", Optics Express, 20(19): 21196-21213). FIG. 4A schematically illustrates a region in an exemplary PRBS spectrum 80 (central −2 GHz to +2 GHz out of a range of −10 GHz to +10 GHz), according to the prior art. The advantages of this modulation are that it has been extensively studied and used in telecom, corresponding drivers exist, the spectral width can be configured in terms of the width of the main lobe controlled by bit rate, the number of spikes within the lobe determined by the number of bits, has already been demonstrated in coherent beam combining of fiber lasers, and is known to provide SBS suppression with corresponding phase modulation. In certain embodiments, an optical frequency shifter (e.g., an acousto-optic frequency shifter—AOFS), may be used to displace the wavelength in one arm of depolarizer 120 to open the possibility of interleaving the overall wavelength spectrum. Typical shifts may be up to ~2 GHz, but lower shifts have higher efficiency. If using the PRBS operating in a $2^7-1$ sequence (127 bits) at 5 GHz for ~40×SBS suppression (as for the PRBS shown in FIG. 4A), the wavelength spikes appear at 39.3 MHz.

In certain embodiments, entire spectrum 80 may be shifted by half of this frequency to provide additional SBS suppression and improving depolarizer performance. FIG. 4B is a high level schematic illustration of spectrum interleaving by depolarizer 120, according to some embodiments of the invention. A waveform with a given spectrum 80 may be split (by a splitter 121) into two arms 122A, 122B of interferometer 122. One arm, illustrated as 122A, may be frequency shifted by an acousto-optic frequency shifter (AOFS) 125, with the signals passing through it being delayed temporally by a path length difference 122C. The signals may be combined, e.g., in a polarization beam splitter (PBS) 123 and a resultant output 128A is an interleaved spectrum 128 with each polarization state 112A, 112B having the same, but shifted, spectra (80). The same concept may be applicable for other periodic modulations since spectral peaks are dictated by Fourier series analysis. These and other sources may include polarized narrowband sources combined into a single fiber with orthogonal polarization states to produce a depolarized source.

Experimental Setups

Figure 5A:
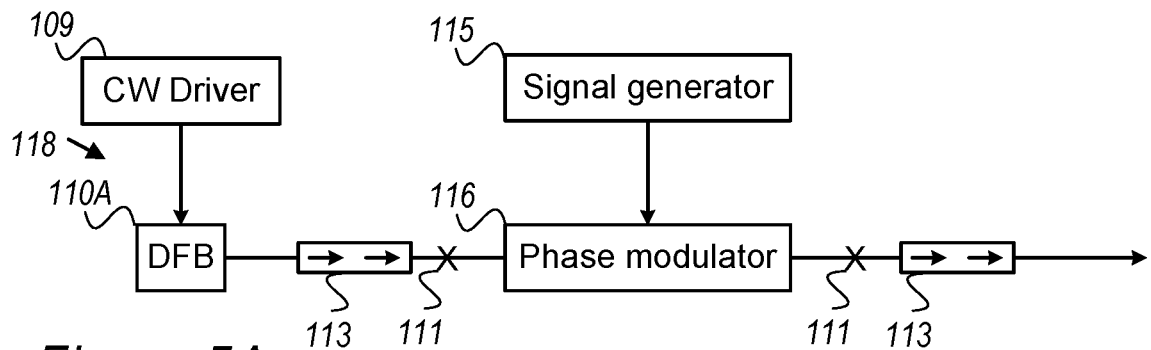
FIGS. 5A-5D are schematic illustrations of experimental setups of narrowband fiber lasers, according to some embodiments of the invention.
Figure 5B:
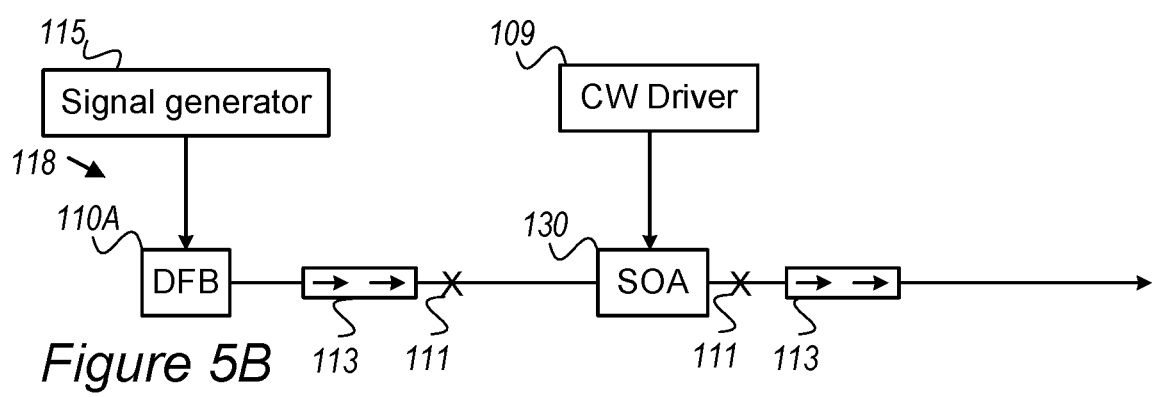
Figure 5C:
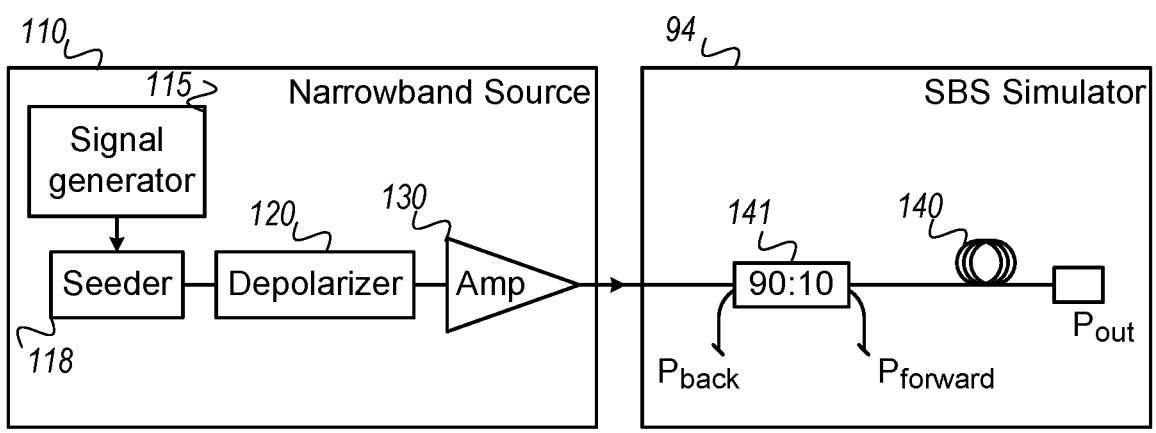

FIGS. 5A-5C are schematic illustrations of experimental setups of narrowband depolarized fiber lasers 100, according to some embodiments of the invention. FIGS. 5A and 5B schematically illustrate seed sources 118 with controllable bandwidth; FIG. 5A schematically illustrates source 118 comprising narrow band (<30 MHz) DFB diode 110A (driven by a CW, continuous wave, driver 109) connected to phase modulator 116 (modulated according to signals from a signal generator 115) configured to provide modulated spectra according to phase modulation theory without changes in the source average power; and FIG. 5B schematically illustrates source 118 comprising current modulated DFB diode 110A (modulated according to signals from signal generator 115) attached to SOA 130, driven by CW driver 109 and operated in high saturation mode (high input signal and low gain) to provide smoothing on the temporal power fluctuations. In both cases significant spectral broadening to the GHz level was experimentally achievable. Connections are indicated as splices 111. It is noted that the pairs of arrows denote a dual stage optical isolator.

Figure 5D:
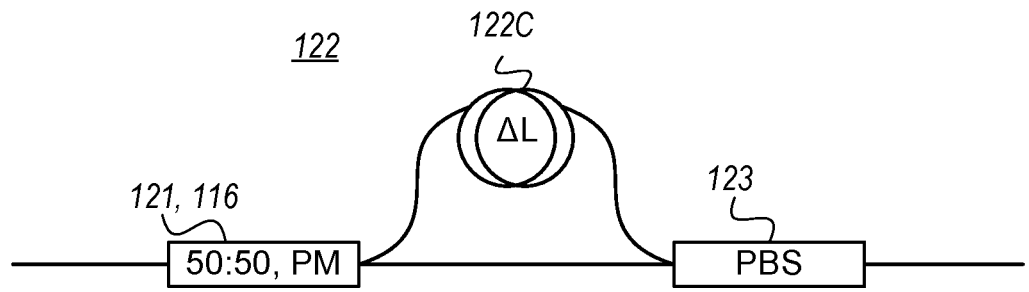

In experiments shown in FIG. 5C, the SBS threshold for different modulations was measured using an SBS simulator 94 having a 5 km length of Corning HI1060 fiber 140 and a coupler to monitor SBS 141 in the backward direction and power in the forward direction. The input power in the 5 km fiber was measured with a 2×2 coupler as well as by the power traveling backward. Part of the power in the backward direction is expected to be from linear scattering mechanisms as well as from SBS. In this experiment, the SBS threshold is defined with the power traveling in the backward direction is twice as high as expected from the linear mechanisms. Narrowband source 110 consisted of either seeders 118 shown in FIGS. 5A, 5B and amplifier 130, in order to raise the output power to reach the SBS threshold. Depolarizer 120 is illustrated in FIG. 5D with a path length delay 122C of about 2 m (10 ns), which may be inserted between seeder 118 and amplifier 130 (see FIG. 5C).

First, the SBS thresholds were measured with both seeders 118 with various modulations without depolarizer 120 to obtain correlation to expected results. In this experiment, the SBS threshold was defined when the level of backward power exceeds 2× the expected background level. As an example, phase modulator 116 voltage signal was a 500 MHz sine wave with its voltage adjusted to obtain three equal optical spectral peaks. As another example, a synthesized noise modulation was added to broadened the spectrum of DFB 110A with direct current modulation and SOA 130 operating in CW mode to smooth the temporal changes in power due to current modulation of the DFB diode. The modulation current to the DFB diode was adjusted to obtain a maximum spectral broadening and a minimum central peak.

Figure 6A:
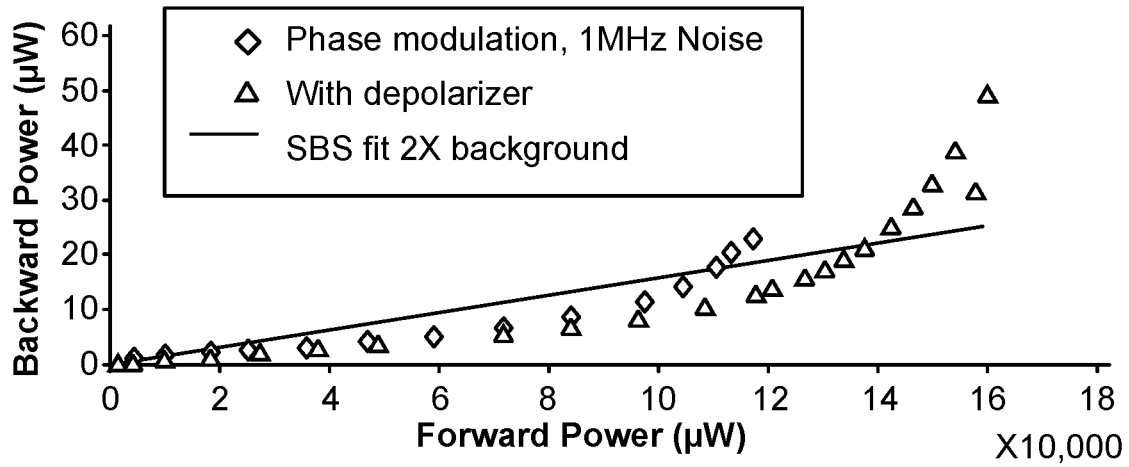
FIGS. 6A and 6B illustrate the backward power for noise modulations of seeders illustrated in FIGS. 5A and 5B, respectively, in the experimental setting, with and without the depolarizer, according to some embodiments of the invention.
Figure 6B:
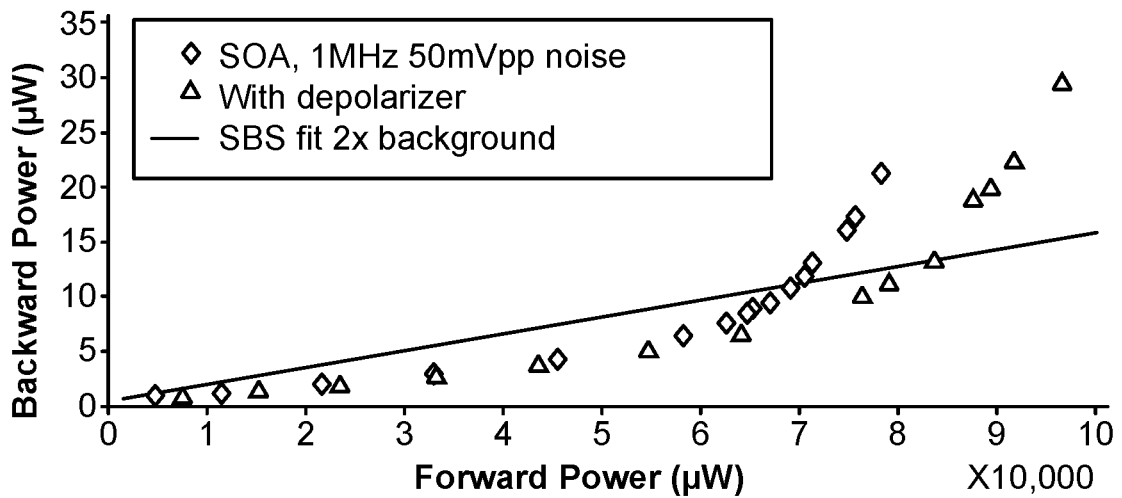

FIGS. 6A and 6B illustrate the backward power for noise modulations of seeders 118 illustrated in FIGS. 5A and 5B, respectively, in the experimental setting, with and without depolarizer 120, according to some embodiments of the invention. FIG. 6A presents the SBS threshold for seeder 118 with phase modulator 116 and 1 MHz noise, FIG. 6B presents the SBS threshold for seeder 118 with SOA 130 and current modulation on DFB diode 110A. The condition for SBS threshold was taken as when the power traveling in the backward direction is twice that expected extrapolated from low power as shown by the solid line. A 20-30% increase in the SBS threshold was obtained using depolarizer 120. The inventors note that using the simple theory for SBS threshold presented above, a factor of 100% increase in SBS threshold would be expected between a polarized source and depolarized source. The lower increase observed experimentally may arise from several factors, such as crudeness of the model, use of periodic noise spectrum, temporal considerations and/or too slow modulation rates. However, it is evident that the provided guidelines, as well as the following disclosure, enable adjustments that increase the SBS beyond the experimental result. In the following experiment, further analysis of the polarization pattern on the SBS threshold is presented to enable the configuration of the depolarization to achieve maximal increase of the SBS threshold.

Figure 7A:
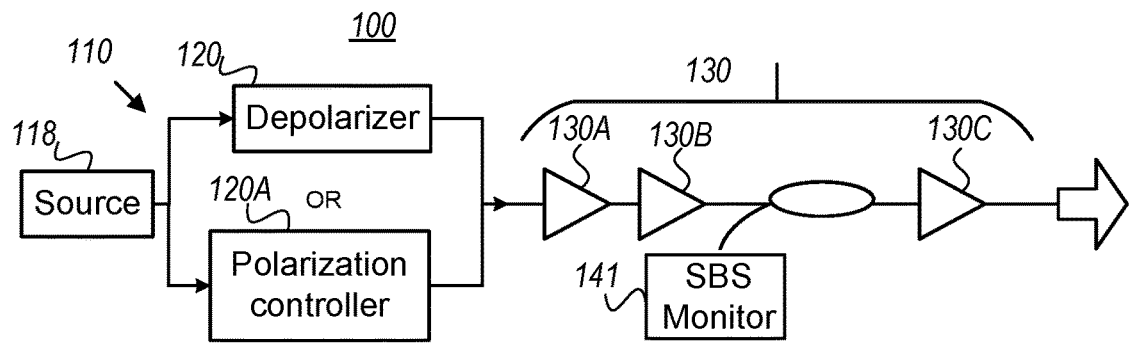
FIGS. 7A-7C illustrate experimental settings and results concerning the dependence of SBS on polarization, according to some embodiments of the invention.
Figure 7B:
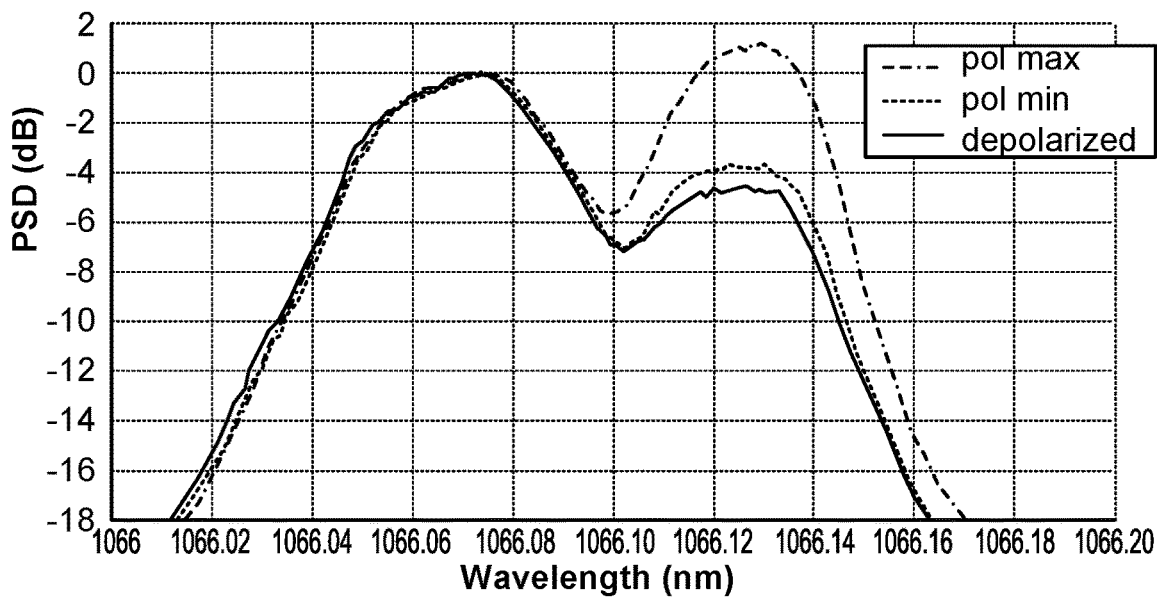
Figure 7C:
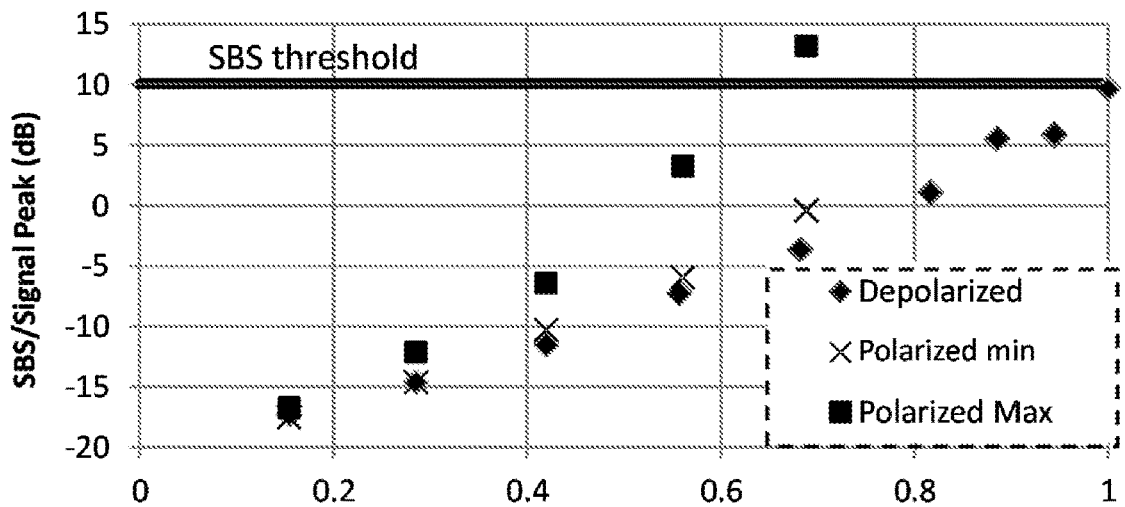

FIGS. 7A-7C illustrate experimental settings and results concerning the dependence of SBS on polarization, according to some embodiments of the invention. Fiber laser 100 at the hundreds of watts level was constructed in order to test the dependence of SBS on the polarization, as illustrated schematically in FIG. 7A. frequency-broadened seed source 110 comprises source 118 and depolarizer 120. Source 118 in this case was a single line DFB diode (Oclaro LC96A1064-DFB) operated in CW mode with less than a 30 MHz inherent line width. The spectrum was broadened by coupling the diode output to a phase modulator (Photline NIR-MPX-LN-10-P-P-FA-FA). The phase modulator was temporally modulated with a voltage signal, for example high frequency white noise (Noisecom NC6126) or a PRBS sequence, to broaden the spectrum up to about 10 GHz (see similar configuration in FIG. 5A). The output was then connected to either a polarization controller to control the polarization state or a depolarizer 120 to provide depolarized light. The output signal was then passed through amplifier 130 comprising a series of three amplifiers 130A, 130B, 130C configured to obtain output power in the hundreds of watts level. The fiber in power amplifier 130 was an LMA-YDF-20/400. All fibers after frequency-broadened seed source 110, that is before first amplifier 130A, were non polarization maintaining (non-PM) fibers so that in principle the polarization of the laser could be controlled. The SBS power was monitored through SBS monitor 141 comprising an optical fiber tap that sampled light travelling backwards from last amplifier (power amplifier) 130C. This signal could either be monitored using an optical spectral analyzer (OSA) to discriminate between SBS power or a power meter. The spectral measurement is often used in order to clearly see the SBS power as it is shifted by approximately 0.06 nm from lasing signal. The power limit from SBS is often taken when the power of the SBS peak is 10 dB higher than the peak at the lasing wavelength when monitoring the backward port 141 using an optical spectral analyzer.

In the first set of experiments, a polarization controller (P.C.) 120A (General Photonics PLC-003-S-250) after source 118 (without depolarizer 120) was adjusted to obtain a maximum and minimum laser signal peak to SBS signal peak ratios as monitored in an optical spectrum analyzer (OSA) (Yokogawa AQ6319). At the power level used and in this specific configuration, it was possible to adjust the ratio of the SBS peak to lasing peak height by about 5 dB simply by adjusting polarization controller 120A. It was also noted that this ratio was not stable in time, most likely due the polarization state changing in the fiber due to environmental factors such as localized heating or fiber stress. However, it was verified that SBS depends strongly on the polarization state of the input signal. In the next experiment, homemade depolarizer 120 with a 0.5 m delay between its different arms was added before polarization controller 120A. In order to check that source 110 was depolarized, the signal was passed through an in-line polarizer and measured using a fast detector with sub-nanosecond response time (Thorlabs DET10A). The signal was observed to be stable and fairly smooth on an oscilloscope. The polarization state was also checked after first two amplifiers 130A, 130B using samples from the fiber taps with similar results. Less than a 5% degree of polarization was measured which is at the sensitivity of the measurement device, thereby verifying that source radiation was depolarized and not randomly polarized (see definitions presented above). It should be noted, that beam taps are often polarization dependent resulting in an uneven sampling of the polarization states. A relatively smooth temporal output trace was observed. The laser was operated at the same power level in the previous experiments. The SBS peak was stable upon manipulating the fiber as indicating stable depolarized polarization operation.

FIG. 7B illustrates the experimental results for the backward propagating signal at SBS monitor 141, showing the power spectral density (PSD) in dB over the relevant wavelength range, and indicating the lowest backward propagating signal for depolarized radiation. FIG. 7B overlays the backward travelling light from power amplifier 130C for the case using depolarized light and polarized light with polarization controller 120A adjusted for maximum and minimum SBS peaks. It is hence observed that the SBS peak of polarized light varies by more than 5 dB's and is not stable, and that depolarized source 110 has a SBS peak about the same or lower than the observed minimum polarization state and is easily reproducible and stable, unlike the polarized beam case. This experiment shows a strong SBS peak dependence on the input seed polarization. The inventors note that polarization dependence of SBS may be due to different sensitivities in SBS gain due to the launched light polarization (see Oskar van Deventer et al. 1994 cited above) and/or different polarization loss mechanisms in the fiber (PDL), the former seems more likely as a depolarized source had the least SBS. Advantageously, disclosed embodiments of narrowband fiber lasers 100 with frequency-broadened seed source 110 overcome these issues to reduce the SBS threshold significantly and reliably, and enable higher power delivery by laser 100.

FIG. 7C is an exemplary experimental measurement of the SBS threshold using a PM active fiber (Nufern PLMA-YDF-20/400-M) in amplifier 130C according to some embodiments of the invention. The backward traveling spectra were measured using an OSA at port 141. In this case the SBS threshold is defined as the level when the SBS spectral peak is 10 dB higher than the signal peak. Using a depolarized seed source with PM active fiber 105, the SBS level was stable and occurred at a normalized value of 1 laser output power. When depolarizer 120 was removed and replaced with a polarization controller, the SBS threshold changed from about 0.6 of the depolarized case (noted as Polarized Max in FIG. 7C) to 1 (noted as Polarized Min in FIG. 7C). It is noted that the Polarized Min case was not taken to SBS threshold power since the peak height was unstable in time. Thus it is shown that that the SBS threshold can be increased by a factor of 50% over the polarized case, using PM active fiber 105.

High power fiber lasers 100 may be depolarized narrow band fiber lasers, which comprise frequency-broadened seed source 110 having seed source 118 with a controllable spectrum and depolarizer 120; and a series of amplifiers 130A-C. Frequency-broadened seed source 110 may comprise a current modulated diode with a SOA and/or a diode with a phase modulator, possibly two or more frequency-broadened seed sources 110 of same or different kinds. Diodes 110A may comprise DFB, ECL (external cavity laser) and/or fiber lasers and SOA 130 may comprise a diode with a circulator. Depolarizer 120 may be of various types, such as any of a Mach-Zehnder type depolarizer (e.g., Mach-Zehnder interferometer 122), two crossed polarized sources with a polarization beam combiner, an intensity noise-driven nonlinear fiber polarization scrambler, an electro-optic polarization scrambler and/or a fiber squeezer.

The spectral control of seed source 118 may be achieved using current modulation on the diode (e.g., a linear chirp, PRBS, white noise, possibly filtered to reduce the side lobes). Depolarizer 120 may comprise a frequency shifter configured to interleave the spectrum of each polarization (see FIG. 4B). Lasers 100 may implement wavelength conversion, SBC and interferometric configurations, as well as additional combinations of elements based on items appearing in U.S. Pat. No. 6,850,712, mentioned above. It is noted however, that U.S. Pat. No. 6,850,712 is used optical transmission/communication systems rather than in a laser amplifier, and it requires a frequency shift on one of the arms. Advantageously, in the current invention defining the depolarized signal to be the seeder of a fiber laser may resolve both of these issues.

Advantageously, disclosed fiber lasers 100 provide narrower band SBC systems with higher beam quality from grating dispersion, beam quality less sensitive to beam size on diffraction grating, more lasers per nm of bandwidth, i.e., more closely packed lasers; and provide an additional factor of 2× in SBS reduction on top of standard methods (spectral broadening) by polarization multiplexing. Moreover, fiber lasers 100 require lower frequency modulation enabling using most components which are limited in spectral response. Disclosed fiber lasers 100 are therefore especially efficient and economical by having reduced constructing costs due to using non-PM components (at least 30-50% savings in components and labor) and by providing repeatable and engineer-able fiber laser seeder sources with sufficient output power. As sources 110 are controllable, software may be used to change the spectral properties of lasers 100. In addition, using depolarizer 120 provides a minimum and stable SBS behavior (as shown e.g., above in FIG. 7C).

In addition to disclosed methods and lasers 100 for depolarizing both broadband band and narrow band laser sources, resulting in increasing the SBS threshold (e.g., by up to 50%) in non-PM fibers, the following provides additional practical methods and lasers 100 for further increasing the SBS threshold. In addition to using depolarizer 120 to scramble the polarization states, an addition of PM (polarization maintaining) fiber 105 (see FIG. 1D) in one or more location(s) susceptible to SBS may further increase the SBS threshold. Depolarized source 110 ensures an equal launching of light into both axes of PM fiber 105, which then only allows linearly polarized modes to propagate along each axis (denoted schematically as fast and slow in FIG. 1D). It is emphasized that while using short non-PM fiber and/or PM fiber without depolarizer 120 provides prior art SBS threshold X, using depolarizer 120 increases the SBS threshold to (up to) 1.5× as shown above and additionally using PM fiber further increases the SBS threshold to (up to) 2×, as shown below.

Figure 8A:
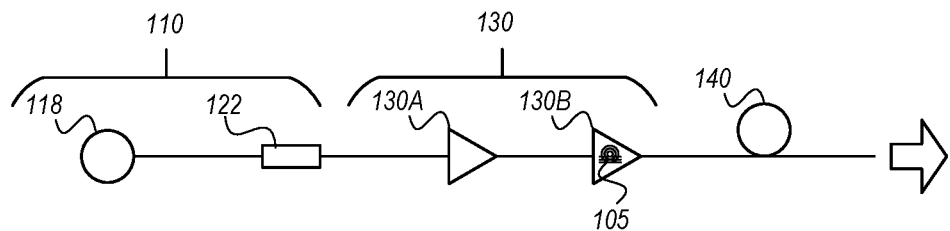
FIGS. 8A-8D illustrate schematically narrowband fiber lasers with PM fibers, according to some embodiments of the invention.
Figure 8B:
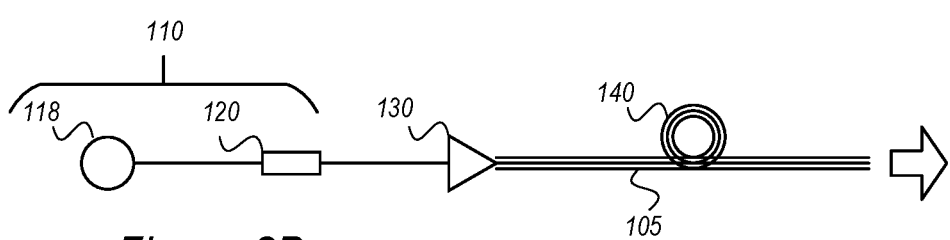
Figure 8C:
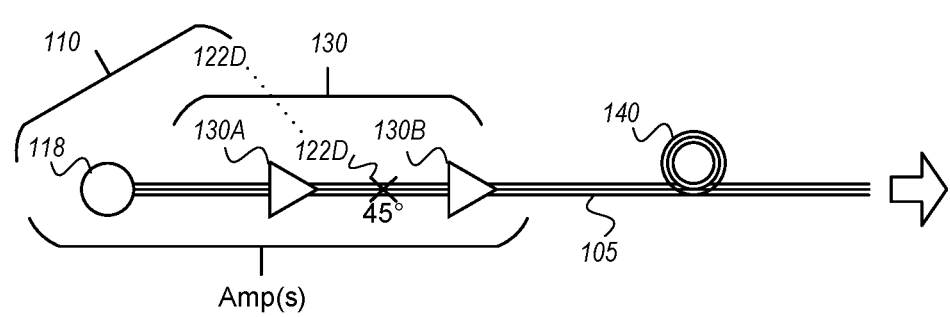
Figure 8D:
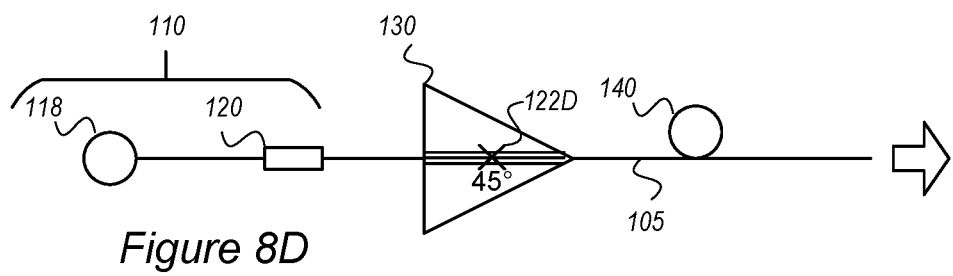

FIGS. 8A-8D illustrate schematically fiber lasers 100 with PM fibers 105, according to some embodiments of the invention. PM fiber 105 may be used in passive and/or in active sections of fiber laser 100. For example, FIG. 8A schematically illustrates switching the fiber in an amplifier 130B from non-PM to PM fiber 105 to increase the SBS threshold. In another example, FIG. 8B schematically illustrates changing delivery fiber 140 of laser 100 from non-PM fiber to PM fiber 105. In either case the SBS threshold can be raised to (up to) 2×, two times the SBS threshold without depolarizer 120. The inventors note that another advantage of disclosed lasers 100 is that the polarization properties of the fiber do not have to be maintained before being launched into PM fiber 105. In certain embodiments, illustrated e.g., in FIG. 8C, fiber laser 100 may comprise PM fibers 105 only, without depolarizer 120. Depolarization may be achieved however by introducing a 45° splice 122D used to launch half of the power along each axis of fiber 100 to achieve depolarization, thereby implementing depolarized source 110 as a combination of source 118 and splice 122D in PM fiber laser 100, and achieving the two-fold increase in the SBS threshold (to 2×). Possibly, 45° splice 122D may be employed in amplifier 130, as illustrated schematically in FIG. 8D. An advantage of such embodiments reliving of the need to maintain the PER (polarization extinction ratio) of laser 100 with respect to lasers 100 with depolarizer 120. These uses of PM fibers 105 may be implemented in either active or passive fibers. For example, splice 122D may also be used in delivery fiber 105 of FIG. 8B. Combinations of PM and non-PM fibers may also be used to reduce the SBS threshold in certain embodiments of the invention.

Certain embodiments comprise fiber lasers 100 with PM fiber 105, having two multiplexed linear polarization states to increase the SBS threshold. Embodiments comprise depolarizer 120 with PM fiber 105 and/or PM fiber source 118 with 45° splice 122D. Various depolarizers 122 may be used, e.g., Mach-Zehnder or Lyot interferometer 122, two orthogonal sources; various PM fiber types may be used, e.g., PANDA PM fiber, PCF (photonic crystal fiber) fiber, elliptical PM fiber, chiral PM fiber, bow-tie PM fiber etc.; PM fiber 105 may be located as/in delivery fiber 140, amplifier fiber etc.; multiple segments of PM fibers 105 may be used and splices 122D in which axes of adjacent PM fiber segments are rotated may be used.

Figure 9A:
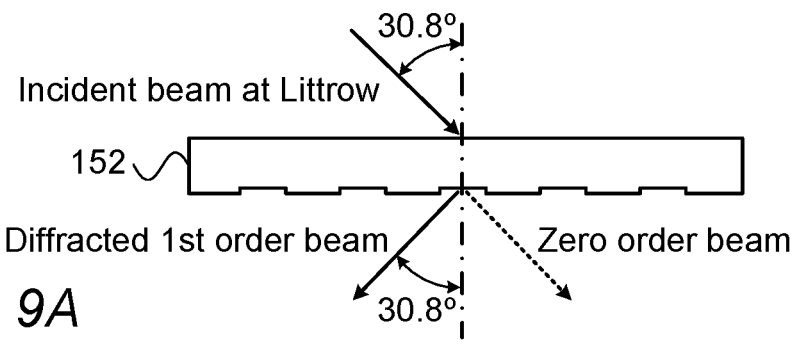
FIGS. 9A-9C illustrate schematically beam combination for a laser system using narrowband depolarized laser sources disclosed above, according to some embodiments of the invention.
Figure 9B:
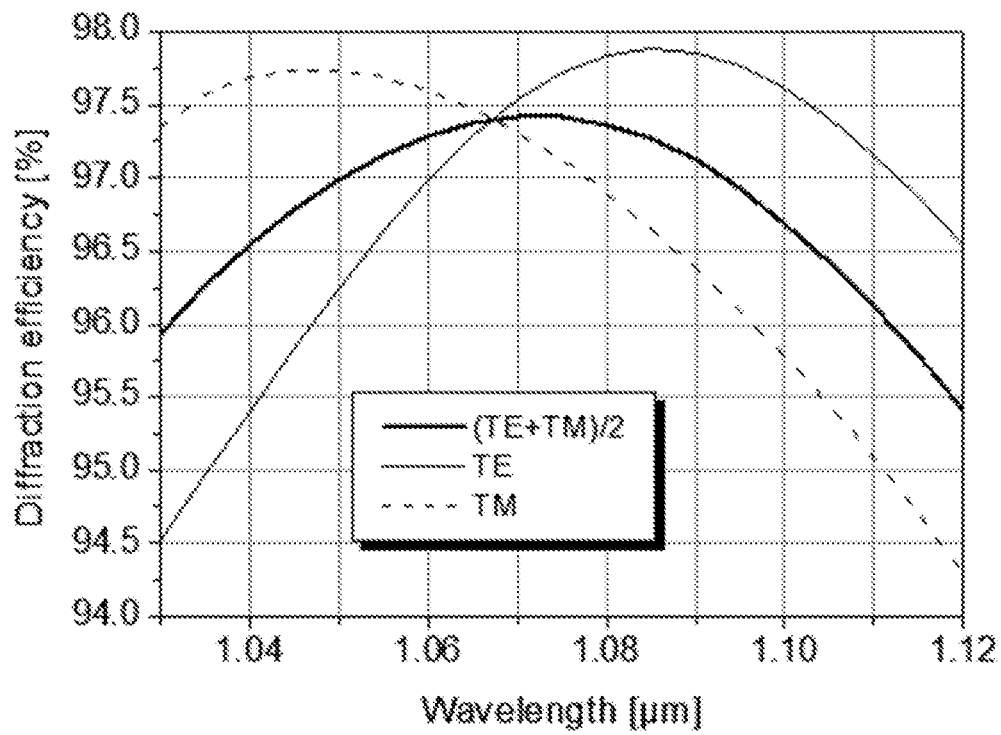
Figure 9C:
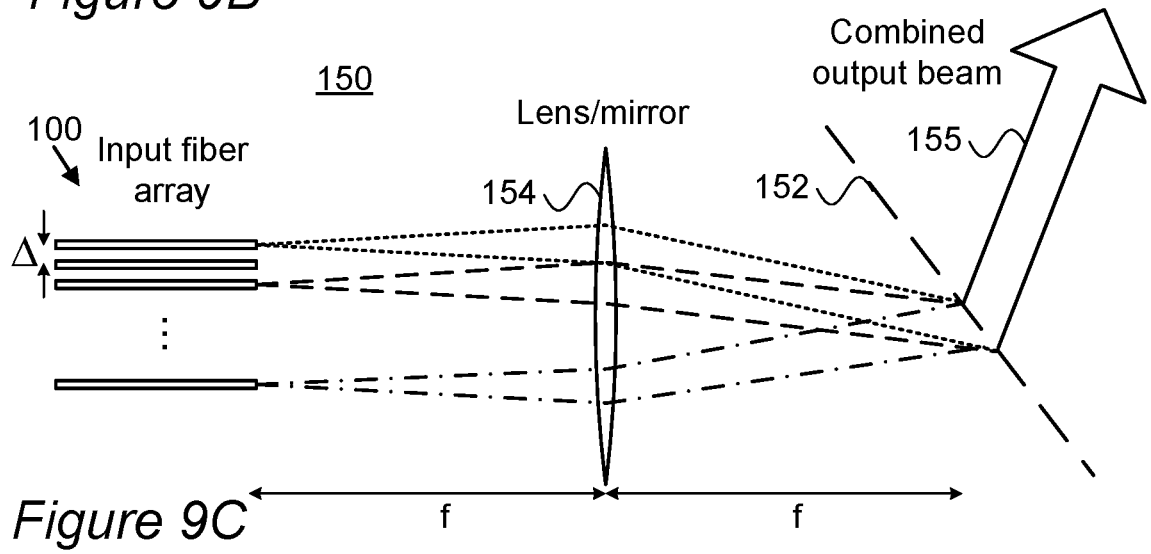

FIGS. 9A-9C illustrate schematically beam combination for a laser system 150 using narrowband depolarized laser sources 100 disclosed above, according to some embodiments of the invention.

Constructing a high power fiber laser beyond a few kilowatts with high beam quality requires combining several low power sources. There are two main approaches to this: spectral beam combining (SBC), and coherent beam combining (CBC). In coherent beam combining, the lasers are combined by matching the property of each beam in each laser exactly to each other. These properties include polarization, phase, wavelength, beam direction, orientation, beam quality and profile, and power. In most practical cases for high power, at least the phase (or wavefronts) of the sources must be actively controlled to achieve coherence between sources. This matching of wavefronts between sources requires active control loops which add significant complexity and cost to the laser system. On the other hand, SBC inherently does not have a need for active control loops. Different color, or wavelength, beams may be combined on a dispersive element, such as grating. If the angle of incidence and wavelength of each source is selected properly, all of the incident beams overlap along the entire output beam path to generate a single "white light" beam (similar to a prism operating in reverse).

Certain embodiments comprise high power SBC laser systems 150 that combine and utilize multiple narrowband depolarized fiber lasers 100, and provide a stable high power combined laser beam with a very high beam quality. Disclosed laser systems 150 are fundamentally different and advantageous with respect to prior art narrowband polarized lasers (taught by Honea, et al. 2013, "Spectrally beam combined fiber lasers for high power efficiency and brightness," Proc. SPIE 8601, 860115-1; and Limpert, et al. 2007), prior art narrowband randomly polarized fiber lasers (taught by Wirth, et al. 2009, "2 kW incoherent beam combining for four narrow-linewidth photonic crystal fiber amplifiers," Optics Express, vol. 17, no. 3, pp. 1178-1183) and prior art broadband fiber lasers (>50 GHz) (taught by Zheng et al. 2016 and U.S. Pat. No. 7,535,631).

In some embodiments, high power SBC laser systems 150 may be implemented using gratings 152 illustrated schematically in FIG. 9A, which may be designed to be polarization insensitive and comprise gratings of either transmission or reflection types. As a non-limiting example, illustrated grating 152 is a polarization independent transmission grating made by etching a piece of fused silica with a specific groove geometry (or using etched glass), which is optimized to provide a relatively polarization insensitive behavior over a large bandwidth. FIG. 9B illustrates a simulation of grating 152 which show a diffraction efficiency greater than 94.5% from 1030 nm to 1120 nm for both polarization states (TE, TM). Two other examples of grating 152 may be produced by (i) depositing a multilayer dielectric coating on a glass substrate and then etching the coating to make a grating at high efficiency for both polarization states (a known example is a grating with a line period of 1379 lines/mm with efficiencies of 92-94% from 1055-1080 nm for both polarization states, another example has a 94% combining efficiency on a reflective multilayer dielectric grating optimized for both polarizations, taught by Zheng et al. 2016); or (ii) a grating designed with ~960 lines/mm with more than 98% diffraction efficiency for both polarizations and a combining efficiency of >97% using randomly polarized lasers (an oscillator configuration fiber laser constructed of non-polarization maintaining fiber with no control of the output polarization state; the polarization state orients itself depending on stresses in the fiber and geometry) as demonstrated in Wirth, et al. 2009.

In an experimental demonstration, the inventors have shown a combining efficiency of 97% using single transmission polarization independent diffraction grating 152 for combining two fiber lasers nominally operating at 10 W. The fiber laser oscillators were made using standard non-polarization maintaining fibers resulting in a naturally depolarized laser output as disclosed above. The spectral widths were measured to be less than 0.1 nm, which was the resolution limitation of the optical spectrum analyzer (the actual width is estimated to be much less than this since the lasers were low power and there was no measurable degradation in beam quality factor $M^2$ after combining). The input beam quality of each laser and the combined output beam quality were approximately $M^2 \sim 1.1$.

FIG. 9C illustrates schematically an example of system 150, according to some embodiments of the invention. In system 150, the output delivery fibers 100 of a set of fiber lasers with different wavelengths may be arranged in an approximately linear array to provide parallel output beam optical axes. A special termination (e.g., an end cap) may be applied on each fiber to allow for precise alignment and high power handling. The linear array is placed in the back focal plane of one or more optical element(s) 154 such as a lens or a mirror. In the front focal plane, grating 152 is placed at the appropriate angle (see FIG. 9A) in order to spectrally combine the beams. A resulting combined output beam 155 has the same beam quality as individual input beams from fibers 100, possibly with degradations due to the angular dispersion of each laser source due to the laser spectral width and mechanical tolerances. The illustrated example in FIG. 9C is a non-limiting far filed example, which may be replaced by other geometries, such as taught by U.S. Pat. No. 7,535,631.

An approximate expression for the increase in $M^2$ due to the laser bandwidth interaction with grating dispersion is given by $$dM^2 = \frac{\omega \pi}{2\lambda \Lambda \cos \theta_L} d\lambda,$$

where $\omega$ is the beam radius on grating 152, $\lambda$ is the laser wavelength, $\Lambda$ is the grating period, $\theta_L$ is the Littrow angle of grating 152 (see FIG. 9A) and $d\lambda$ is the bandwidth of the laser source (see Limpert, et al. 2007). In a non-limiting example, a polarization independent grating 152 with 960 lines/mm and delivery fibers 100 with a nominal core and clad diameter of 20 and 250 microns, respectively, may be used. The output mode field diameter of each fiber may be approximately 17.6 microns around 1060 nm, and the focal length of lens 154 and the wavelength spacing of fiber lasers 100 may be selected in order to have the fiber pitch spacing in the input array to be 250 microns, which is the fiber diameter. With a wavelength spacing of 1 nm between fiber lasers 100, the focal length of lens 154 is approximately f=22 cm. Assuming the bandwidth of each laser is 10 GHz, then the output beam quality is approximately $M^2=1.5$ given $M^2=1$ input beams. The increase in $M^2$ is due to grating dispersion. Assuming that the bandwidth of the lasers is decreased to 3 GHz, then $M^2$ of the combined beam would be less than $M^2=1.2$.

Certain embodiments comprise laser system 150 comprising multiple fiber lasers 100, at least one optical element 154 configured to combine outputs of fiber lasers 100 (which may be collimated individually) and a polarization insensitive grating 152 configured and set to generate output beam 155 from the combine outputs of fiber lasers 100. For example, grating 152 may comprise transmission grating(s), reflective grating(s), diffraction grating(s) and combinations thereof. Optical element(s) 154 may comprise lens(s) and/or mirror(s), at least one of which may be set at focal length distances from a common output plane of fiber lasers 100 and from grating 152. The setting parameters of system 150 may be determined by performance requirements, for example according to $$dM^2 = \frac{\omega \pi}{2\lambda \Lambda \cos \theta_L} d\lambda,$$

as explained above.

Certain embodiments comprise various spectral beam combining techniques using more than one grating, such as described, e.g., in U.S. Pat. Nos. 7,233,422, 7,199,924 and 7,535,631. For example, such or similar embodiments may be used to reduce the effect of beam quality degradation due to spectral width. In some embodiments, the use of a depolarized fiber laser source may be configured to increase performance by increasing the power provided per given bandwidth.

Advantageously, using depolarized fiber laser 100 enables to raise the power by a factor of two over the polarized fiber case due to the increased SBS threshold. Using low dispersion polarization insensitive gratings 152 relaxes the bandwidth constraints on fiber laser 100, and if the bandwidth is increased, then the output of each fiber laser 100 can be increased as the power limiting SBS threshold also increases. In contrast, in the prior art, for example using a polarized 1740 line/mm grating, the wavelength spacing between fiber laser sources decreases to 0.2 nm but the resultant $M^2=3$ due to the dispersion of 10 GHz line width on the grating. The focal length of the lens may be decreased in order to decrease this effect, but often times this has practical limitations, including the size of the components. Even if going to, for example, an f=15 cm lens, the $M^2$ decreases only to 2.4 as the divergence of the beam on the grating increases relative to the grating dispersion. Therefore, the disclosed invention is superior in performance to the prior art.

Figure 10:
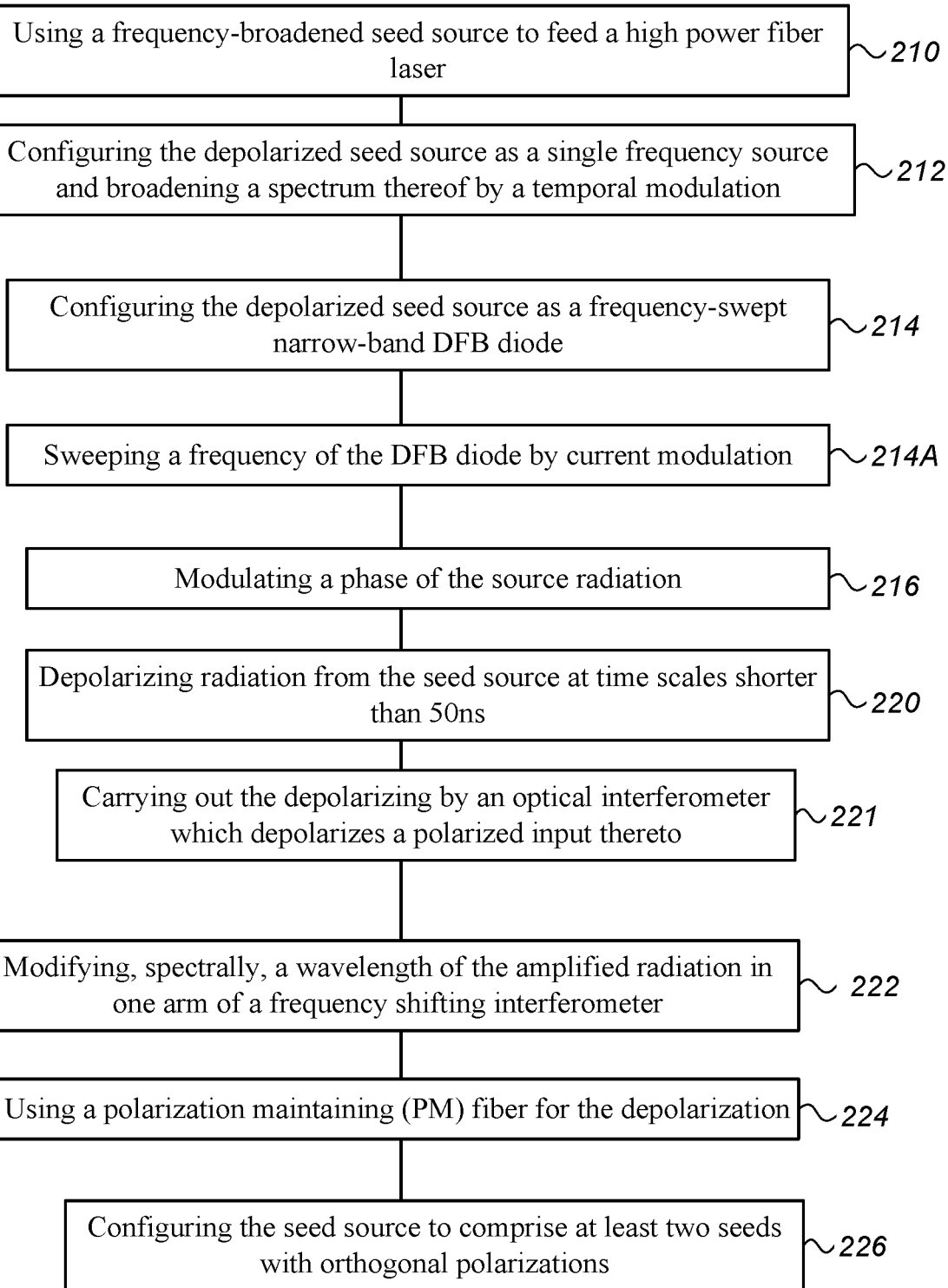
FIG. 10 is a high level flowchart illustrating a method, according to some embodiments of the invention.

FIG. 10 is a high level flowchart illustrating a method 200, according to some embodiments of the invention. Method 200 may comprise any of the following stages, illustrated not necessarily by their execution order. These method stages are described in more detail with respect to fiber lasers 100 described above and which may be configured to implement and/or according to method 200.

Method 200 comprises using, in a fiber laser having an optical fiber, a frequency-broadened narrowband seed source, wherein the narrowband seed source has a spectral width of less than 10 GHz, which is broadened to a spectral width of less than 50 GHz (stage 210), depolarizing radiation from the seed source to provide a depolarized output which is depolarized on time scales shorter than 50 ns (stage 220), or in some embodiments, shorter than 10 ns, and amplifying the depolarized radiation and delivering the amplified radiation in the optical fiber (stage 230). Amplification may be to high power, possibly to over 10 W.

Method 200 may further comprise configuring the frequency-broadened seed source as a single frequency source and broadening a spectrum thereof by a temporal modulation (stage 212). Method 200 may further comprise configuring the frequency-broadened seed source as a frequency-swept narrow-band distributed feedback (DFB) diode (stage 214), and optionally sweeping a frequency of the DFB diode by current modulation (stage 214A).

Method 200 may further comprise modulating a phase of the source radiation, e.g., using a phase modulator (stage 216).

Method 200 may further comprise carrying out depolarizing 220 by an optical interferometer, configured to depolarize a polarized input thereto (stage 221), for example method 200 may comprise carrying out depolarizing 220 by an optical frequency shifting interferometer and modifying, spectrally, a wavelength of the amplified radiation in one arm of the interferometer (stage 222).

Method 200 may comprise using a polarization maintaining (PM) fiber for depolarizing 220 (stage 224), and configuring the frequency-broadened seed source to comprise at least two seeds with orthogonal polarizations (stage 226) which are delivered to the PM fiber.

Method 200 may further comprise carrying out amplifying 230 by at least one SOA configured to stabilize, temporally, the received radiation (stage 232). Method 200 may further comprise locating the at least one PM fiber segment between amplifier stages, at an amplifier exit and/or at an amplifier entrance (stage 235).

Method 200 may further comprise incorporating at least one PM fiber segment into the optical fiber to split received depolarized radiation between at least two optical axes thereof (stage 240). Method 200 may further comprise splicing one or multiple PM fiber segment(s) to the optical fiber to form angles between their respective optical axes (stage 245).

Method 200 may further comprise comprising optically combining outputs of a plurality of the fiber lasers onto a polarization insensitive grating (stage 250) and generating, by the grating, an output beam from the combined outputs of the fiber lasers (stage 260). In some embodiments, method 200 may comprise configuring the grating as a transmission grating and carrying out the optical combining of fiber laser outputs by at least one optical element set at focal length distances from a common output plane of the fiber lasers and from the grating (stage 265).

LIST OF ELEMENTS IN THE DRAWINGS AND THEIR NUMERALS

PRBS spectrum 80
SBS simulator 94
Fiber lasers 100
PM fiber 105
CW (continuous wave) driver 109
Frequency-broadened seed source 110 e.g., DFB diode 110A
Single frequency source 112
Orthogonal polarization states 112A, 112B, e.g., along fast axis 112A and slow axis 112B
Current modulator 114
Signal generator 115
Phase modulator 116
Seed sources with controllable bandwidth 118
Depolarizer 120
Polarization controller 120A
Splitter 121
Interferometer 122
Two arms of the interferometer 122A, 122B, path length difference 122C
45° splice 122D
Polarization beam splitter (PBS) 123
AOFS 125
Interleaved spectrum 128
Resultant output 128A
Amplifier(s) (e.g., SOA) 130, amplifiers 130A, 130B, 130C
Optical fiber 140
SBS monitor 141
Ways of incorporating PM fibers 142-145
Laser systems 150
Grating 152
Optical element(s) 154
Combined output beam 155
Method 200 and stages 210-265 thereof In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A fiber laser comprising:
a frequency-broadened narrowband seed source, comprising a narrowband seed source having a spectral width of less than 10 GHz, wherein an output of the narrowband seed source is broadened to a spectral width of less than 50 GHz;
a depolarizer coupled to an output of the frequency-broadened narrowband seed source and configured to provide a depolarized output, wherein the depolarized output is depolarized on time scales shorter than 50 ns;
at least one amplifier coupled to an output of the depolarizer, wherein the amplifier is configured to receive and amplify the depolarized output and
an optical fiber connecting the seed source, the depolarizer and the at least one amplifier and configured to receive the amplified radiation from the at least one amplifier, the optical fiber comprising at least one segment of a PM fiber having at least two optical axes,
wherein the at least one PM fiber segment is configured to split received depolarized radiation between the at least two optical axes thereof.

2. The fiber laser of claim 1, wherein the frequency-broadened seed source comprises a single frequency source which is broadened by a temporal modulation.

3. The fiber laser of claim 2, wherein the frequency-broadened seed source comprises a frequency-swept narrow-band distributed feedback (DFB) diode.

4. The fiber laser of claim 3, wherein a frequency of the DFB diode is swept by current modulation.

5. The fiber laser of claim 2, wherein the frequency-broadened seed source comprises a phase modulator configured to modulate a phase of the source radiation.

6. The fiber laser of claim 1, wherein the depolarizer comprises an optical interferometer configured to depolarize a polarized input thereto.

7. The fiber laser of claim 6, wherein the interferometer is of a Mach-Zehnder or a Lyot type.

8. The fiber laser of claim 1, wherein the depolarizer comprises an optical frequency shifting interferometer configured to modify, spectrally, a wavelength of the amplified radiation in one arm of the interferometer.

9. The fiber laser of claim 8, wherein the interferometer is of a Mach-Zehnder or a Lyot type.

10. The fiber laser of claim 1, wherein the at least one amplifier is further configured to amplify the depolarized output to over 10 W.

11. The fiber laser of claim 1, wherein the frequency-broadened seed source comprises at least two seeds with orthogonal polarizations.

12. The fiber laser of claim 1, wherein the at least one amplifier comprises at least one semiconductor optical amplifier (SOA).

13. The fiber laser of claim 1, wherein the at least one PM fiber segment is located between stages of the at least one amplifier.

14. The fiber laser of claim 1, wherein the at least one PM fiber segment is located at an exit of the at least one amplifier.

15. The fiber laser of claim 1, wherein the at least one PM fiber segment comprises a plurality of PM fiber segments, spliced to form angles between their respective optical axes.

16. The fiber laser of claim 1, wherein at least one of the at least one amplifier comprises an active PM fiber.

17. A laser system comprising:
a plurality of the fiber lasers of claim 1,
at least one optical element configured to combine outputs of the fiber lasers, and
at least one polarization insensitive grating configured and set to generate an output beam from the combined outputs of the fiber lasers.

18. The laser system of claim 17, wherein the at least one grating comprises a reflective grating.

19. The laser system of claim 17, wherein the at least one grating comprises a transmission grating.

* * * * *